United States Patent
Ebiko

(10) Patent No.: US 8,853,053 B2
(45) Date of Patent: Oct. 7, 2014

(54) CAPACITIVE ELEMENT, MANUFACTURING METHOD OF THE SAME, SOLID-STATE IMAGING DEVICE, AND IMAGING APPARATUS

(71) Applicant: Sony Corporation, Tokyo (JP)

(72) Inventor: Yoshiki Ebiko, Kumamoto (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/964,459

(22) Filed: Aug. 12, 2013

(65) Prior Publication Data

US 2013/0323901 A1 Dec. 5, 2013

Related U.S. Application Data

(62) Division of application No. 12/661,760, filed on Mar. 23, 2010, now Pat. No. 8,531,564.

(30) Foreign Application Priority Data

Mar. 31, 2009 (JP) .............................. P2009-086669

(51) Int. Cl.
| | |
|---|---|
| H01L 21/76 | (2006.01) |
| H01L 29/94 | (2006.01) |
| H01L 29/66 | (2006.01) |
| H04N 5/3745 | (2011.01) |
| H04N 5/378 | (2011.01) |
| H01L 49/02 | (2006.01) |
| H01L 27/146 | (2006.01) |

(52) U.S. Cl.
CPC ................ *H01L 28/40* (2013.01); *H01L 29/94* (2013.01); *H01L 29/66181* (2013.01); *H04N 5/37457* (2013.01); *H04N 5/378* (2013.01); *H01L 27/14643* (2013.01); *H01L 27/14609* (2013.01)
USPC ............ 438/439; 438/250; 438/396; 348/294

(58) Field of Classification Search
USPC ............ 257/532; 438/396, 250, 439; 348/294
See application file for complete search history.

(56) References Cited

U.S. PATENT DOCUMENTS

| | | | |
|---|---|---|---|
| 6,787,430 B2 * | 9/2004 | Kanamori | ...................... 438/393 |
| 6,965,141 B2 | 11/2005 | Mikawa | |
| 7,812,382 B2 | 10/2010 | Iida | |
| 2002/0130393 A1 | 9/2002 | Takayanagi et al. | |
| 2005/0242383 A1 | 11/2005 | Mikawa | |
| 2008/0199994 A1 | 8/2008 | Ohgishi | |
| 2011/0281418 A1 | 11/2011 | Morikado | |

FOREIGN PATENT DOCUMENTS

JP          61-048957 A          3/1986

* cited by examiner

*Primary Examiner* — Nicholas Tobergte
(74) *Attorney, Agent, or Firm* — Lerner, David, Littenberg, Krumholz & Mentlik, LLP

(57) ABSTRACT

A capacitive element, includes: an active region parted by an element isolation region formed in a semiconductor substrate; a first electrode formed of a diffusion layer in the active region; an insulating layer formed on the first electrode; and a second electrode formed on a planar surface of the first electrode via the insulating layer, wherein the second electrode is formed within the active region and within the first electrode in a planar layout.

2 Claims, 21 Drawing Sheets

ION IMPLANTATION

CAPACITIVE ELEMENT, MANUFACTURING METHOD OF THE SAME, SOLID-STATE IMAGING DEVICE, AND IMAGING APPARATUS

CROSS-REFERENCE TO RELATED APPLICATION

The present application is a divisional of U.S. patent application Ser. No. 12/661,760, filed Mar. 23, 2010, which claims priority from Japanese Patent Application No. JP 2009-086669 filed in the Japanese Patent Office on Mar. 31, 2009, the entire contents of which are incorporated herein by reference.

BACKGROUND OF THE INVENTION

1. Field of the Invention

The present invention relates to a capacitive element, a manufacturing method of the same, a solid-state imaging device, and an imaging apparatus.

2. Description of the Related Art

The MOS capacitor has an inflection point (inversion and accumulation in the case of n-type and p-type, respectively) in the capacitance value near the flat band, and its capacitance value varies with the gate voltage.

As a capacitor that has an inflection point near the flat band, or specifically a capacitor without voltage following characteristics, a capacitive element of the structure including a gate electrode, a silicon oxide ($SiO_2$) film, and a silicon layer with high-concentration impurities is known. In such a capacitive element, a silicon substrate is subjected to high-concentration ion implantation to degenerate the silicon Fermi level, and the resulting metal-like portion is used as the channel layer. After the ion implantation, a thermally-oxidized film is formed on a surface of the silicon substrate, and a gate electrode is formed via the thermally-oxidized film to form the capacitive element.

For example, JP-A-61-048957 discloses a technique in which, after forming a thermally-oxidized film on a semiconductor substrate surface, an opening is formed through the thermally-oxidized film, and a thin oxide film is formed on the semiconductor substrate in the opening. Then, high-concentration ion implantation is performed over the thin oxide film to form a high-concentration region in the semiconductor substrate, and a metal electrode is formed on the thin oxide film to form a MOS capacitor.

Generally, an element isolation region of a LOCOS structure or an STI (Shallow Trench Isolation) structure is formed in the region of a silicon substrate where the capacitive element is formed. Descriptions below are based on an element isolation region of a LOCOS structure.

To prevent contamination, knocking, and damage during ion implantation, a pre-oxide film realized by a thin thermally-oxidized film of, for example, 10 nm to 30 nm thickness is formed on the silicon substrate surface after forming the element isolation region.

Then, in order to produce a channel in the high concentration region, impurities are ion implanted at high concentration over the pre-oxide film. Here, as in the channel region, impurities are ion implanted at high concentration also in, for example, the element isolation region (silicon oxide film).

Then, as illustrated in FIG. 20A, an element isolation region 112 formed of a silicon oxide film is formed on a silicon substrate 111 using a LOCOS method (local oxidation method), and a pre-oxide film 151 is formed on the silicon substrate 111. The silicon substrate 111 is then subjected to high-concentration ion implantation through the pre-oxide film 151 to form a first electrode 121 formed of a diffusion layer. Here, the silicon oxide film of the element isolation region 112 not covered by a resist mask 141 is damaged by the ion implantation (not shown). Though not shown, the silicon substrate 111 is subjected to low-concentration ion implantation underneath the edge of the element isolation region 112.

After the ion implantation, the pre-oxide film 151 is removed with a hydrofluoric acid-based chemical in the pre-washing performed to form a capacitor oxide film, and the surface of the silicon substrate 111 is cleaned by SC washing (APM washing).

As a result, as illustrated in FIG. 20B, the pre-oxide film 151 (see FIG. 20A) is removed, and the silicon substrate 111 is exposed.

However, in practice, as illustrated in FIG. 21A, the silicon oxide film of the element isolation region 112 damaged during the ion implantation is overetched more than undamaged portions in the removal of the pre-oxide film 151 (see FIG. 20A). This is because the silicon oxide film of the element isolation region 112 damaged during the ion implantation has a faster etching rate than undamaged portions.

The portion subjected to the high-concentration ion implantation at the edge of the element isolation region 112 is damaged by the ion implantation, and thus the silicon oxide film of the element isolation region 112 is overetched and the silicon substrate 111 is exposed. The overetching of the silicon oxide film is particularly notable at the bird's beak portion of the LOCOS structure. The overetching is particularly prominent when the amount of ion implanted impurities (dose) is $1 \times 10^{14}/cm^2$ or more.

As a result, a silicon substrate portion 111A not subjected to high-concentration ion implantation is exposed.

Thereafter, as illustrated in FIG. 21B, a capacitor oxide film 122 is formed on the surface of the silicon substrate 111 using, for example, a thermal oxidation method. Here, because the impurity concentration is higher in the first electrode 121 portion, the capacitor oxide film 122 becomes therein thicker than in the silicon substrate portion 111A not subjected to high-concentration ion implantation. That is, what is known as enhanced oxidation occurs. Because the silicon substrate portion 111A exposed by the overetching of the element isolation region 112 is shielded by the element isolation region 112 and is not subjected to high-concentration ion implantation, the capacitor oxide film 122 becomes thinner therein than in the portion subjected to high-concentration ion implantation (first electrode 121).

Then, as illustrated in FIG. 22, a second electrode 123 is formed on the capacitor oxide film 122 to form a capacitive element 120 including the first electrode 121, the capacitor oxide film 122, and the second electrode 123. Because the capacitor oxide film 122 has thickness variation, the thin portion at the edge of the element isolation region 112 also acts as a capacitor in the capacitive element 120 using the capacitor oxide film 122, and this capacitor presents the problem of parasitic capacitance. Further, such a portion acts as a parallel capacitor, and causes deterioration in the overall voltage following characteristics of the capacitive element. Furthermore, the voltage resistance is low in the thin portion of the capacitor oxide film 122. As a result, the reliability of the capacitive element 120 is poor.

SUMMARY OF THE INVENTION

There is a need to overcome the difficulty in forming the capacitor oxide film of the capacitive element in a uniform thickness by thermal oxidation.

The present invention enables the capacitor insulating film to be formed in a uniform thickness to improve the overall voltage following characteristics and the voltage resistance of the capacitive element for improved reliability.

A capacitive element according to an embodiment of the present invention includes:

an active region parted by an element isolation region formed in a semiconductor substrate;

a first electrode formed of a diffusion layer in the active region;

a capacitor insulating film formed on the first electrode; and a second electrode formed on a planar surface of the first electrode via the capacitor insulating film, wherein the second electrode is formed within the active region and within the first electrode in a planar layout.

In the capacitive element according to the embodiment of the present invention, the second electrode is formed on a planar surface of the first electrode, and accordingly the capacitor insulating film underlying the second electrode is also formed on the planar surface of the first electrode. The capacitor insulating film is therefore formed in a uniform thickness.

A method for manufacturing a capacitive element according to an embodiment of the present invention includes the steps of:

forming in a semiconductor substrate an element isolation region that parts an active region;

ion implanting impurities in the active region so as to form a first electrode formed of a diffusion layer;

forming a capacitor insulating film on the first electrode; and forming a second electrode above a planar surface of the first electrode via the capacitor insulating film, wherein the second electrode is formed within the active region and within the first electrode in a planar layout.

In the manufacturing method of a capacitive element according to the embodiment of the present invention (first manufacturing method), the second electrode is formed on a planar surface of the first electrode, and accordingly the capacitor insulating film underlying the second electrode is also formed on the planar surface of the first electrode. Thus, the capacitor insulating film of the capacitive element is formed in a uniform thickness on the planar surface of the first electrode.

A method for manufacturing a capacitive element according to an embodiment of the present invention includes the steps of:

ion implanting impurities in a region of a semiconductor substrate to be an active region so as to form a first electrode formed of a diffusion layer;

forming in the semiconductor substrate an element isolation trench that parts the active region;

embedding an insulating film in the element isolation trench to form an element isolation region;

forming a capacitor insulating film on the first electrode; and forming a second electrode on the capacitor insulating film, the element isolation trench being formed in part by removing a peripheral portion of the first electrode, and portions of the semiconductor substrate surrounding the peripheral portion of the first electrode.

In the manufacturing method of a capacitive element according to the embodiment of the present invention (second manufacturing method), the first electrode formed of a diffusion layer is formed by high-concentration ion implantation in the region of the semiconductor substrate to be the active region, prior to producing an element isolation region of an STI structure. Thereafter, the element isolation trench where the element isolation region is formed is formed by removing the peripheral portion of the first electrode, and portions of the semiconductor substrate surrounding it. Thus, the first electrode as a high-concentration ion implantation region is formed throughout the active region, and the capacitor insulating film formed on the first electrode has a uniform thickness. Thus, the second electrode is formed on the capacitor insulating film formed in a uniform thickness.

A solid-state imaging device according to an embodiment of the present invention includes:

a pixel section including a photoelectric converter that produces a signal charge by photoelectric conversion of incident light;

a column processor including a plurality of column AD circuits each of which includes a comparator that compares a signal charge output from the pixel section with a reference voltage for AD conversion; and a capacitive element provided between an output side of the pixel section and the comparator, that cuts a DC component, wherein the capacitive element includes: an active region parted by an element isolation region formed in a semiconductor substrate; a first electrode formed of a diffusion layer in the active region; a capacitor insulating film formed on the first electrode; and a second electrode formed on a planar surface of the first electrode via the capacitor insulating film, wherein the second electrode is formed within the active region and within the first electrode in a planar layout.

An imaging apparatus according to an embodiment of the present invention includes:

a light-condensing optical section that condenses incident light;

a sensing section including a solid-state imaging device that receives the light condensed by the light-condensing optical section, and that subjects the light to photoelectric conversion; and a signal processor that processes signals subjected to photoelectric conversion in the solid-state imaging device, the solid-state imaging device including:

a pixel section including a photoelectric converter that produces a signal charge by photoelectric conversion of incident light;

a column processor including a plurality of column AD circuits each of which includes a comparator that compares a signal charge output from the pixel section with a reference voltage for AD conversion; and a capacitive element provided between an output side of the pixel section and the comparator, that cuts a DC component, wherein the capacitive element includes: an active region parted by an element isolation region formed in a semiconductor substrate; a first electrode formed of a diffusion layer in the active region; a capacitor insulating film formed on the first electrode; and a second electrode formed on a planar surface of the first electrode via the capacitor insulating film, wherein the second electrode is formed within the active region and within the first electrode in a planar layout.

A capacitive element according to an embodiment of the present invention includes a capacitor insulating film formed in a uniform thickness, and is therefore free from parasitic capacitance, making the overall voltage following characteristics of the capacitive element desirable. Further, because the capacitor insulating film does not have a thin portion, there is no deterioration of voltage resistance in any part of the film.

This improves the voltage resistance of the capacitive element, and thus improves reliability.

In the first manufacturing method of a capacitive element according to an embodiment of the present invention, the capacitor insulating film is formed in a uniform thickness, and therefore there is no parasitic capacitance, making the overall voltage following characteristics of the capacitive element desirable. Further, because the capacitor insulating film does not have a thin portion, there is no deterioration of voltage resistance in any part of the film. This improves the voltage resistance of the capacitive element, and thus improves reliability.

In the second manufacturing method of a capacitive element according to an embodiment of the present invention, the capacitor insulating film is formed in a uniform thickness, and therefore there is no parasitic capacitance, making the overall voltage following characteristics of the capacitive element desirable. Further, because the capacitor insulating film does not have a thin portion, there is no deterioration of voltage resistance in any part of the film. This improves the voltage resistance of the capacitive element, and thus improves reliability.

The solid-state imaging device according to an embodiment of the present invention uses a capacitive element according to an embodiment of the present invention. The overall voltage following characteristics of the capacitive element are therefore desirable, making it possible to realize a stable signal process.

The imaging apparatus according to an embodiment of the present invention uses a solid-state imaging device according to an embodiment of the present invention. Because the solid-state imaging device is capable of stable signal processing, a high-quality image can be obtained.

DESCRIPTION OF THE PREFERRED EMBODIMENTS

The following describes embodiments for carrying out the present invention (hereinafter, "embodiments").

<1. First Embodiment>

[First Example of a Structure of a Capacitive Element]

A first example of a structure of a capacitive element according to a First Embodiment of the present invention is described below with reference the planar layout diagram of FIG. 1A, and the cross sectional view of FIG. 1B taken along the line A-A' of FIG. 1A.

Figure 1A:
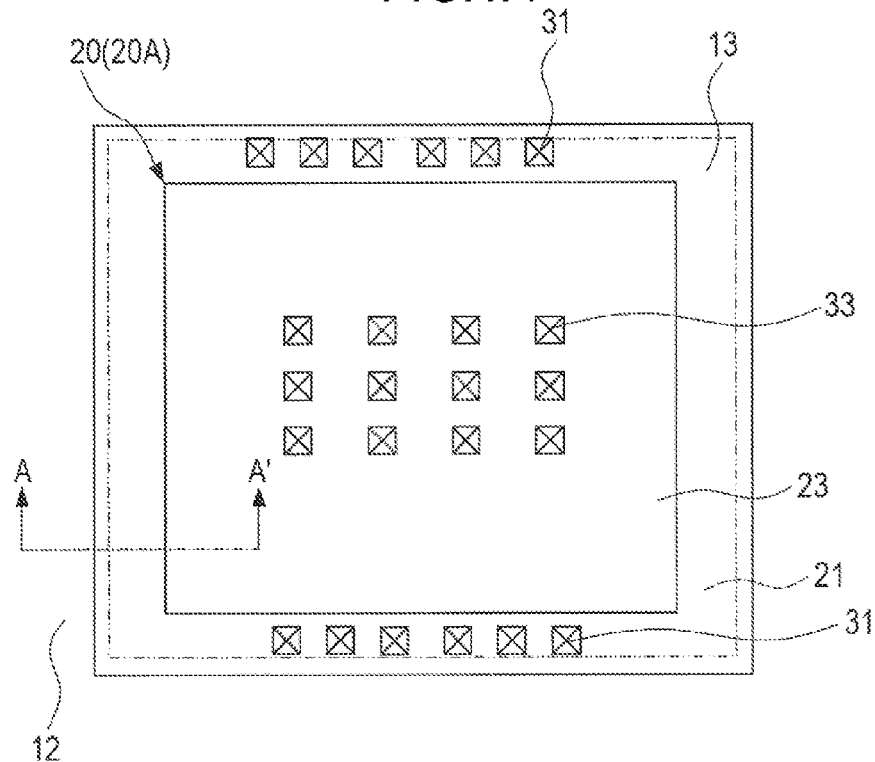
FIG. 1A is a planar layout diagram representing a first example of a structure of a capacitive element according to a First Embodiment of the present invention.
Figure 1B:
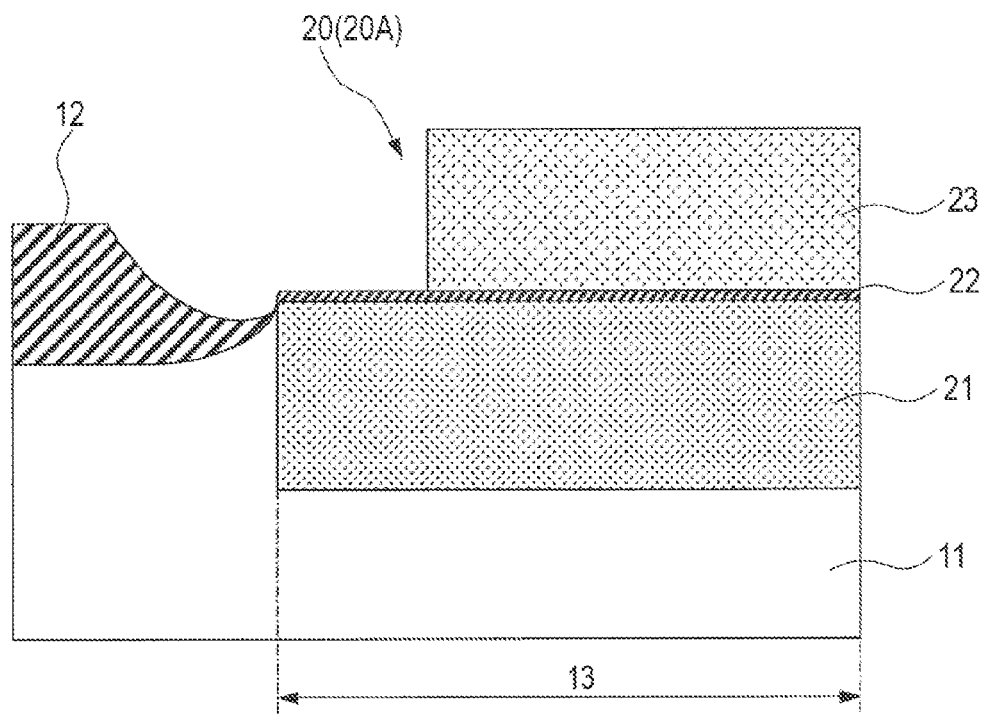
FIG. 1B is a cross sectional view taken along the line A-A' of FIG. 1A.

As illustrated in FIGS. 1A and 1B, a semiconductor substrate 11 includes an active region 13 parted by an element isolation region 12. The semiconductor substrate 11 uses, for example, a silicon substrate. The element isolation region 12 is, for example, an element isolation region of a LOCOS structure.

The active region 13 includes a first electrode 21 formed of a diffusion layer. The diffusion layer of the first electrode 21 has an impurity concentration of, for example, $1 \times 10^{18}$ atoms/cm$^3$ or more.

Figure 2:
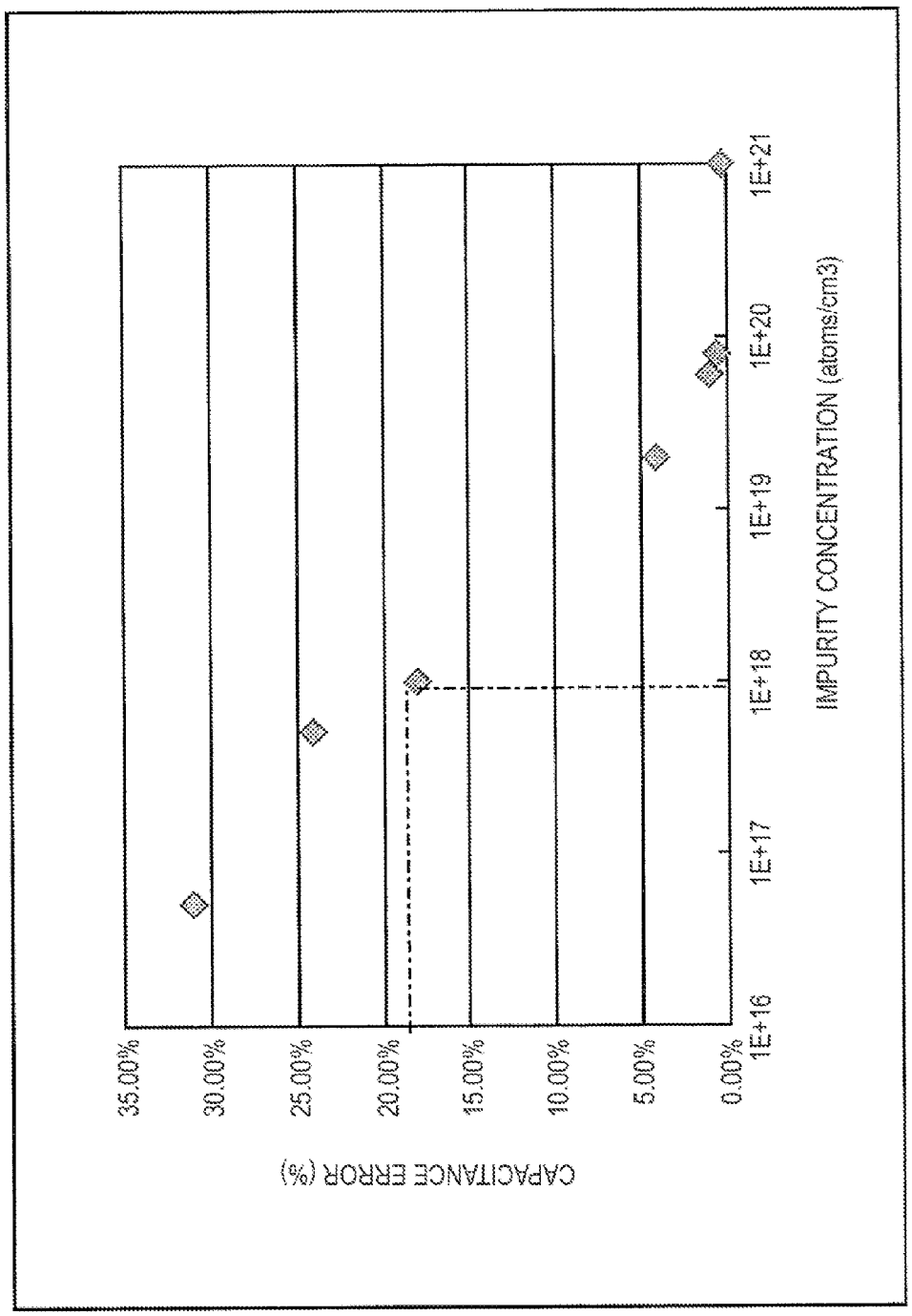
FIG. 2 is a diagram representing a relationship between a deviation of the capacitance values and the impurity concentration of a first electrode.

For example, when the first electrode 21 is produced by making the silicon (Si) substrate metal-like through degeneration of the silicon (Si) Fermi level by high-concentration ion implantation into the silicon (Si) substrate, the diffusion layer of the first electrode 21 is adapted to have an impurity concentration of, for example, $1 \times 10^{18}$ atoms/cm$^3$ or more. Further, as represented in FIG. 2, the impurity concentration is, for example, $2 \times 10^{19}$ atoms/cm$^3$ or more for a deviation of the capacitance values of about 5%. For a deviation of the capacitance values of about 1% or less, the impurity concentration is preferably, for example, $8 \times 10^{19}$ atoms/cm$^3$ or more.

The deviation of the capacitance values represented by the vertical axis in FIG. 2 is the percentage calculated according to the following equation.

Deviation of capacitance values=[(capacitance of the capacitive element under applied voltage of 5 V)−(capacitance of the capacitive element under applied voltage of −5 V)]/(capacitance of the capacitive element under applied voltage of 5 V)

The horizontal axis represents the impurity concentration of the first electrode 21.

The impurities used to form the diffusion layer include n-type impurities such as phosphorus, arsenic, and antimony, and p-type impurities such as boron and indium.

The first electrode 21 may be formed throughout the active region 13, or may be formed in the active region 13 with a predetermined space from the element isolation region (for example, as in the state indicated by long dashed double-short dashed lines in the Figure) in a planar layout.

A capacitor insulating film 22 is formed on the first electrode 21. The capacitor insulating film 22 is a silicon oxide film formed by, for example, thermal oxidation of the semiconductor substrate 11.

Via the capacitor insulating film 22, a second electrode 23 is formed on a planar surface of the first electrode 21, specifically, on the region of the first electrode 21 having a uniform concentration.

In this manner, a capacitive element 20 (20A) is formed that includes the first electrode 21, the capacitor insulating film 22, and the second electrode 23.

In the capacitive element 20A, the first electrode is formed by, for example, ion implantation, after the element isolation region 12 is formed in the semiconductor substrate 11. Prior to the ion implantation, a pre-oxide film is formed on the surface of the semiconductor substrate 11. The pre-oxide film is removed after the ion implantation. Here, the peripheral portion of the element isolation region 12 is removed at the same time, and the surface of the semiconductor substrate 11 is exposed. Thus, the thickness of the capacitor insulating film 22 is uniform on the planar surface in the active region 13, whereas the portion formed on the exposed surface of the semiconductor substrate 11 after the removal of the element isolation region 12 is thin.

The second electrode 23 is formed on the planar surface of the first electrode 21, and accordingly the portion of the capacitor insulating film 22 underlying the second electrode 23 is also formed on the planar surface of the first electrode 21. That is, the capacitor insulating film 22 between the first electrode 21 and the second electrode 23 is formed on the planar surface of the first electrode 21, and thus has a uniform thickness.

In this manner, because the capacitive element 20A formed of the first electrode 21, the capacitor insulating film 22, and the second electrode 23 includes the capacitor insulating film 22 of a uniform thickness, there will be no parasitic capacitance, and the overall voltage following characteristics of the capacitive element 20A become desirable. Further, because the capacitor insulating film 22 does not have a thin portion, the voltage resistance does not deteriorate in any part of the film, and the voltage resistance of the capacitive element 20A is improved.

In other words, the overall voltage following characteristics of the capacitive element 20A become desirable, and the voltage resistance of the capacitive element can be improved for improved reliability.

Note that, in the capacitive element 20A, because the second electrode 23 is formed within the active region 13, contact portions 33 provided for the extraction of the second electrode 23 are formed on the second electrode 23 by being connected thereto. The state shown in the Figure includes a plurality of contact portions 33.

The first electrode 21 can be extracted by, for example, forming contact portions 31 on the first electrode 21 between the second electrode 23 and the element isolation region 12. As illustrated in the Figure, the contact portions 31 may be formed on the first electrode 21 along two sides of the second electrode 23, or along only one side of the second electrode 23. It is also possible to form the contact portions 31 on the first electrode 21 along three or four sides of the first electrode 21 or the second electrode 23.

[Second Example of a Structure of a Capacitive Element]

A second example of a structure of a capacitive element according to the First Embodiment of the present invention is described below with reference the planar layout diagram of FIG. 3A, and the cross sectional view of FIG. 3B taken along the line B-B' of FIG. 3A.

Figure 3A:
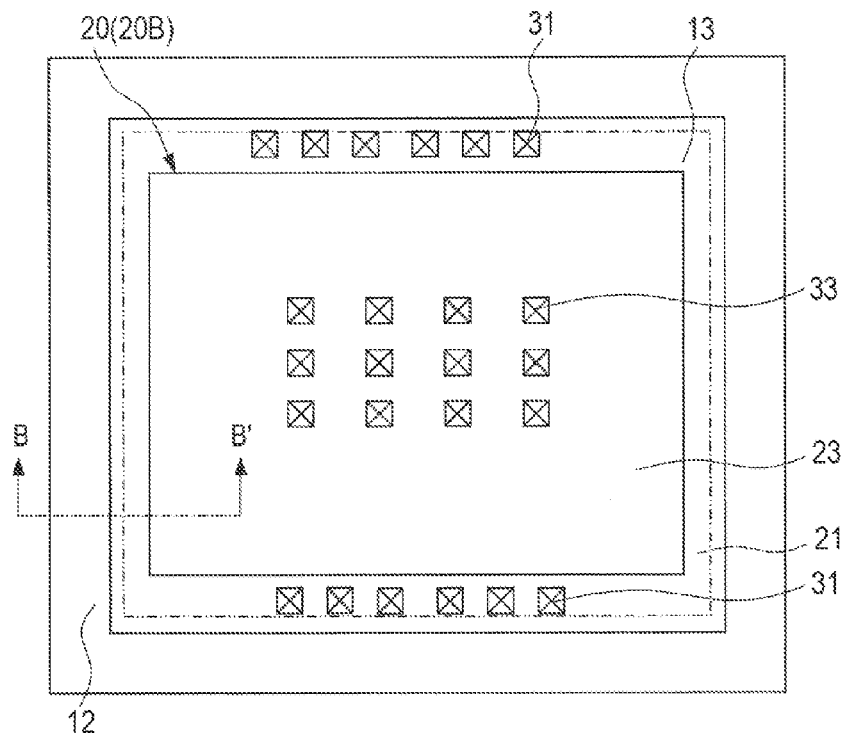
FIG. 3A is a planar layout diagram representing a second example of a structure of a capacitive element according to the First Embodiment of the present invention.
Figure 3B:
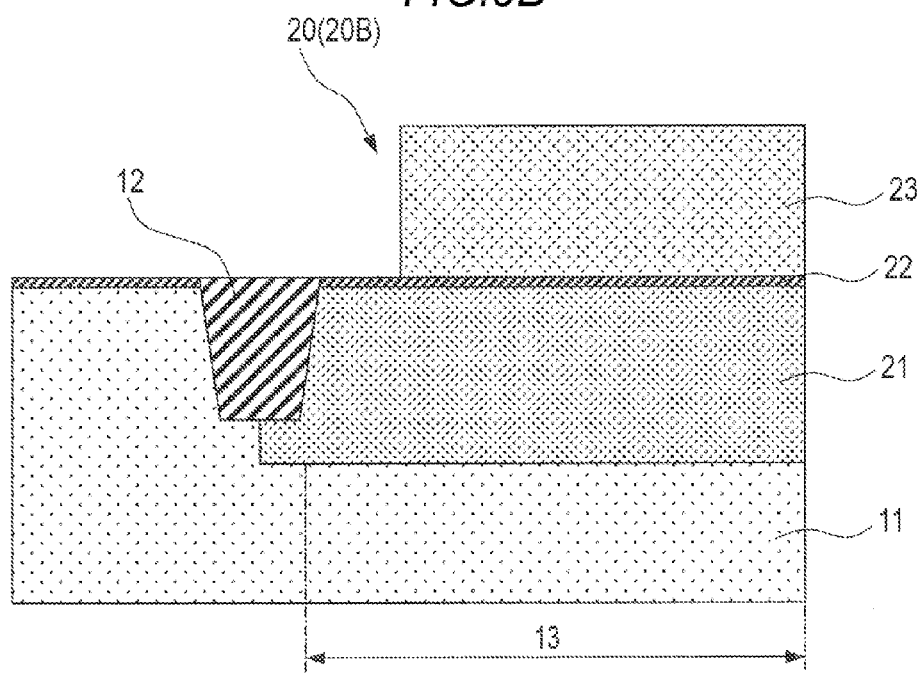
FIG. 3B is a cross sectional view taken along the line B-B' of FIG. 3A.

As illustrated in FIGS. 3A and 3B, a semiconductor substrate 11 includes an active region 13 parted by an element isolation region 12. The semiconductor substrate 11 uses, for example, a silicon substrate. The element isolation region 12 is, for example, an element isolation region of an STI (Shallow Trench Isolation) structure.

The active region 13 includes a first electrode 21 formed of a diffusion layer. The diffusion layer of the first electrode 21 has an impurity concentration of, for example, $1\times10^{18}$ atoms/$cm^3$ or more. The impurities used to form the diffusion layer include n-type impurities such as phosphorus, arsenic, and antimony, and p-type impurities such as boron and indium. As illustrated in the Figure, the first electrode 21 may protrude into a portion underneath the element isolation region 12.

For example, when the first electrode 21 is produced by making the silicon (Si) substrate metal-like through degeneration of the silicon (Si) Fermi level by high-concentration ion implantation into the silicon (Si) substrate, the diffusion layer of the first electrode 21 is adapted to have an impurity concentration of, for example, $1\times10^{18}$ atoms/$cm^3$ or more. Further, the impurity concentration is, for example, $1\times10^{19}$ atoms/$cm^3$ or more for a deviation of the capacitance values of about 5%. For a deviation of the capacitance values of about 1% or less, the impurity concentration is preferably, for example, $1\times10^{20}$ atoms/$cm^3$ or more.

The first electrode 21 may be formed throughout the active region 13, or may be formed in the active region 13 with a predetermined space from the element isolation region 12 (for example, as in the state indicated by long dashed double-short dashed lines in FIG. 3A) in a planar layout.

A capacitor insulating film 22 is formed on the first electrode 21. The capacitor insulating film 22 is a silicon oxide film formed by, for example, thermal oxidation of the semiconductor substrate 11.

Via the capacitor insulating film 22, a second electrode 23 is formed on a planar surface of the first electrode 21, specifically, on the region of the first electrode 21 having a uniform concentration.

In this manner, a capacitive element 20 (20B) is formed that includes the first electrode 21, the capacitor insulating film 22, and the second electrode 23.

In the capacitive element 20B, the first electrode is formed by, for example, ion implantation, after the element isolation region 12 is formed in the semiconductor substrate 11. Prior to the ion implantation, a pre-oxide film is formed on the surface of the semiconductor substrate 11. The pre-oxide film is removed after the ion implantation. Here, the peripheral portion of the element isolation region 12 is removed at the same time, and the surface of the semiconductor substrate 11 is exposed. Thus, the thickness of the capacitor insulating film 22 is uniform on the planar surface in the active region 13, whereas the portion formed on the exposed surface of the semiconductor substrate 11 after the removal of the element isolation region 12 is thin.

The second electrode 23 is formed on the planar surface of the first electrode 21, and accordingly the portion of the capacitor insulating film 22 underlying the second electrode 23 is also formed on the planar surface of the first electrode 21. That is, the capacitor insulating film 22 has a uniform thickness in a portion on the planar surface of the first electrode 21.

Alternatively, in the capacitive element 20B, the first electrode 21 is formed by, for example, ion implantation, before the element isolation region 12 is formed in the semiconductor substrate 11. Prior to the ion implantation, a pre-oxide film is formed on the surface of the semiconductor substrate 11. The pre-oxide film is removed after the ion implantation. The element isolation trench to form the element isolation region 12 is formed in part by removing the peripheral portion of the first electrode 21, and portions of the semiconductor substrate 11 surrounding it. Thus, the capacitor insulating film 22 formed on the surface of the active region 13 is formed only on the planar surface of the active region 13, and therefore has a uniform thickness.

In this manner, because the capacitive element 20B formed of the first electrode 21, the capacitor insulating film 22, and the second electrode 23 includes the capacitor insulating film 22 of a uniform thickness, there will be no parasitic capacitance, and the overall voltage following characteristics of the capacitive element 20B become desirable. Further, because the capacitor insulating film 22 does not have a thin portion, the voltage resistance does not deteriorate in any part of the film, and the voltage resistance of the capacitive element 20B is improved.

In other words, the overall voltage following characteristics of the capacitive element 20B become desirable, and the voltage resistance of the capacitive element can be improved for improved reliability.

Note that, in the capacitive element 20B, because the second electrode 23 is formed within the active region 13 in a planar layout, contact portions 33 provided for the extraction of the second electrode 23 are formed on the second electrode 23 by being connected thereto. The state shown in the Figure includes a plurality of contact portions 33.

The first electrode 21 can be extracted by, for example, forming contact portions 31 on the first electrode 21 between the second electrode 23 and the element isolation region 12. As illustrated in the Figure, the contact portions 31 may be formed on the first electrode 21 along two sides of the second electrode 23, or along only one side of the second electrode 23. It is also possible to form the contact portions 31 on the first electrode 21 along three or four sides of the first electrode 21 or the second electrode 23.

[A Variation of the Second Example of a Capacitive Element]

A variation of the second example of a capacitive element is described below with reference the planar layout diagram of FIG. 4A, and the cross sectional view of FIG. 4B taken along the line C-C' of FIG. 4A.

Figure 4A:
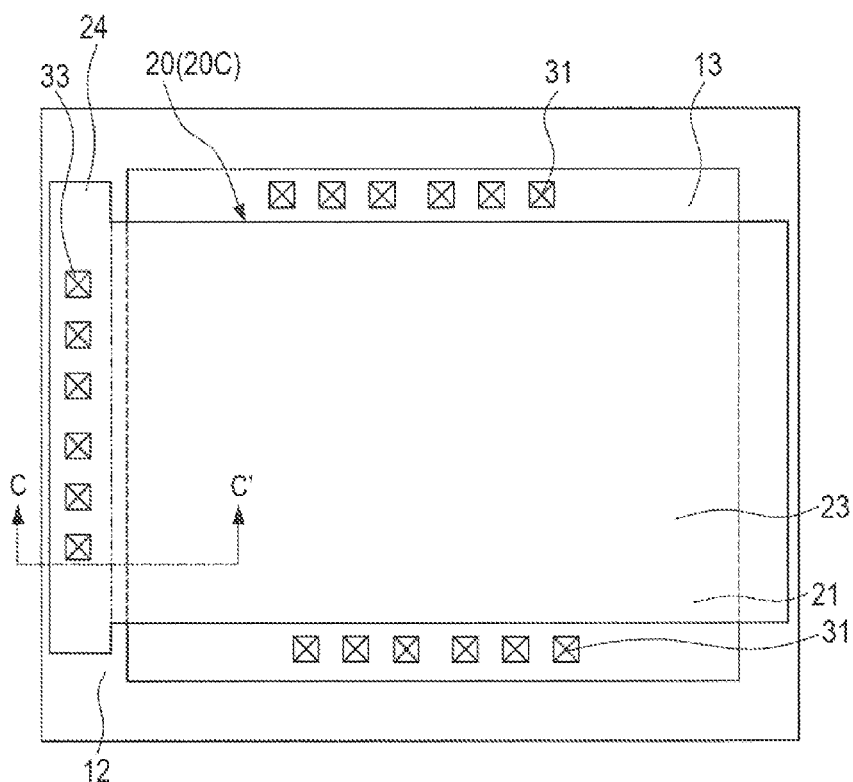
FIG. 4A is a planar layout diagram representing a variation of the second example of a capacitive element.
Figure 4B:
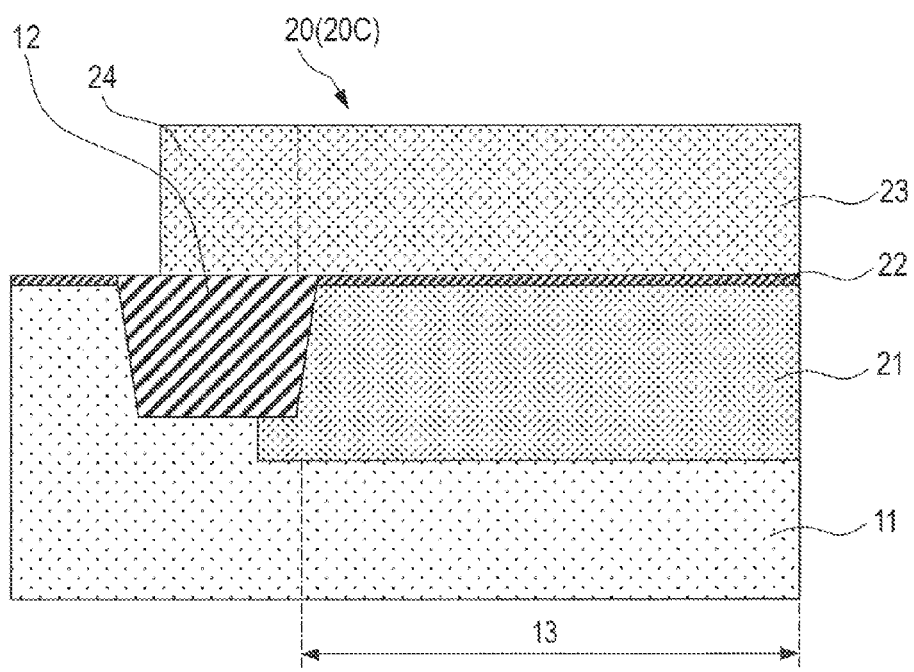
FIG. 4B is a cross sectional view taken along the line C-C' of FIG. 4A.

As illustrated in FIGS. 4A and 4B, a capacitive element 20C has the same structure as the capacitive element 20B except for the position of the second electrode 23.

A semiconductor substrate 11 includes an active region 13 parted by an element isolation region 12. The semiconductor substrate 11 uses, for example, a silicon substrate. The element isolation region 12 is an element isolation region of an STI structure.

The active region 13 includes a first electrode 21 formed of a diffusion layer.

The first electrode 21 is formed throughout the active region 13 in a planar layout.

A capacitor insulating film 22 is formed on the first electrode 21. The capacitor insulating film 22 is a silicon oxide film formed by, for example, thermal oxidation of the semiconductor substrate 11.

Via the capacitor insulating film 22, a second electrode 23 is formed on a planar surface of the first electrode 21, specifically, on the region of the first electrode 21 having a uniform concentration, with a partial overlap with the element isolation region 12. The second electrode 23 includes an electrode pad portion 24 continuous to the second electrode 23 and formed on the element isolation region 12.

In this manner, a capacitive element 20 (20C) is formed that includes the first electrode 21, the capacitor insulating film 22, and the second electrode 23.

In this manner, because the capacitive element 20C formed of the first electrode 21, the capacitor insulating film 22, and the second electrode 23 includes the capacitor insulating film 22 of a uniform thickness, there will be no parasitic capacitance, and the overall voltage following characteristics of the capacitive element 20C become desirable. Further, because the capacitor insulating film 22 does not have a thin portion, the voltage resistance does not deteriorate in any part of the film, and the voltage resistance of the capacitive element 20C is improved.

In other words, the overall voltage following characteristics of the capacitive element 20C become desirable, and the voltage resistance of the capacitive element can be improved for improved reliability.

Note that, in the capacitive element 20C, the second electrode 23 extends from the active region 13 to the element isolation region 12 in a planar layout, and the electrode pad portion 24 continuous to the second electrode 23 is formed on the element isolation region 12. Thus, the contact portions 33 provided for the extraction of the second electrode 23 are formed on the electrode pad portion 24. The state shown in the Figure includes a plurality of contact portions 33.

The first electrode 21 can be extracted by, for example, forming contact portions 31 on the first electrode 21 between the second electrode 23 and the element isolation region 12. As illustrated in the Figure, the contact portions 31 may be formed on the first electrode 21 along two sides of the second electrode 23, or along only one side of the second electrode 23.

<2. Second Embodiment>

[First Example of a Manufacturing Method of a Capacitive Element]

The following describes a first example of a capacitive element manufacturing method according to a Second Embodiment of the present invention with reference to the planar layout diagrams and the cross sectional views of manufacturing steps illustrated in FIGS. 5A to 10. The manufacturing method is an exemplary manufacturing method of the capacitive element 20A. The cross sectional views of FIGS. 5A to 10 show cross sections taken along the line A-A' of the corresponding planar layout diagrams.

Figure 5A:
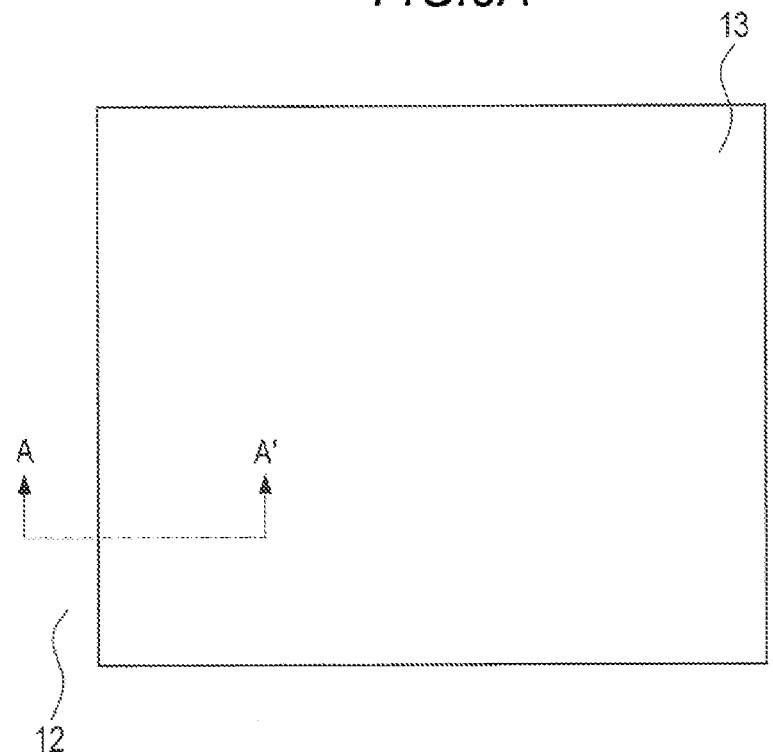
FIG. 5A is a planar layout diagram representing a first example of a manufacturing method of a capacitive element according to a Second Embodiment of the present invention.
Figure 5B:
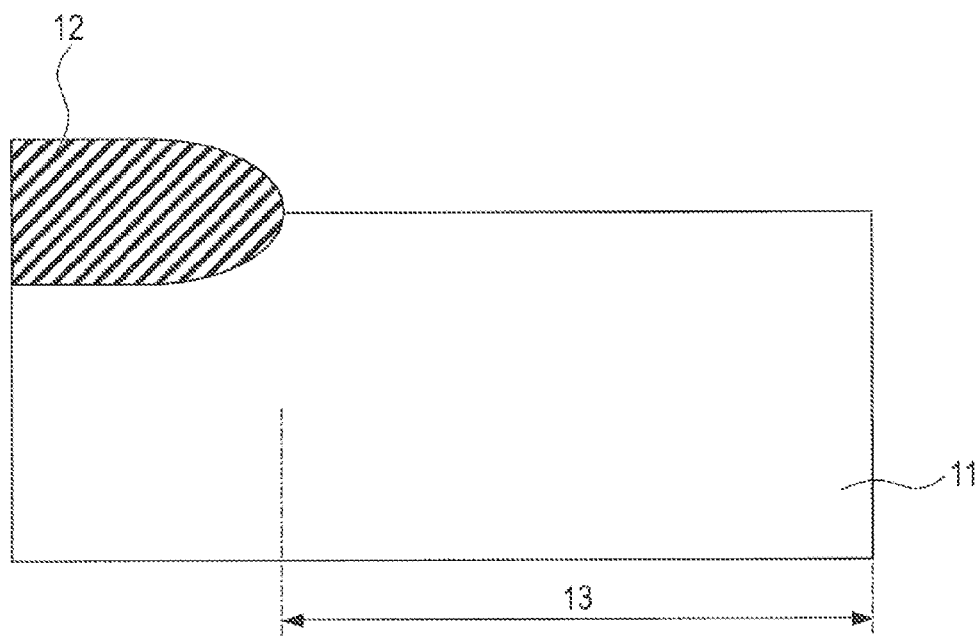
FIG. 5B is a cross sectional view of a manufacturing step.

As illustrated in FIGS. 5A and 5B, the element isolation region 12 that parts the active region 13 is formed on the semiconductor substrate 11 using, for example, a common LOCOS method (local oxidation method). The semiconductor substrate 11 uses, for example, a silicon substrate.

Figure 6A:
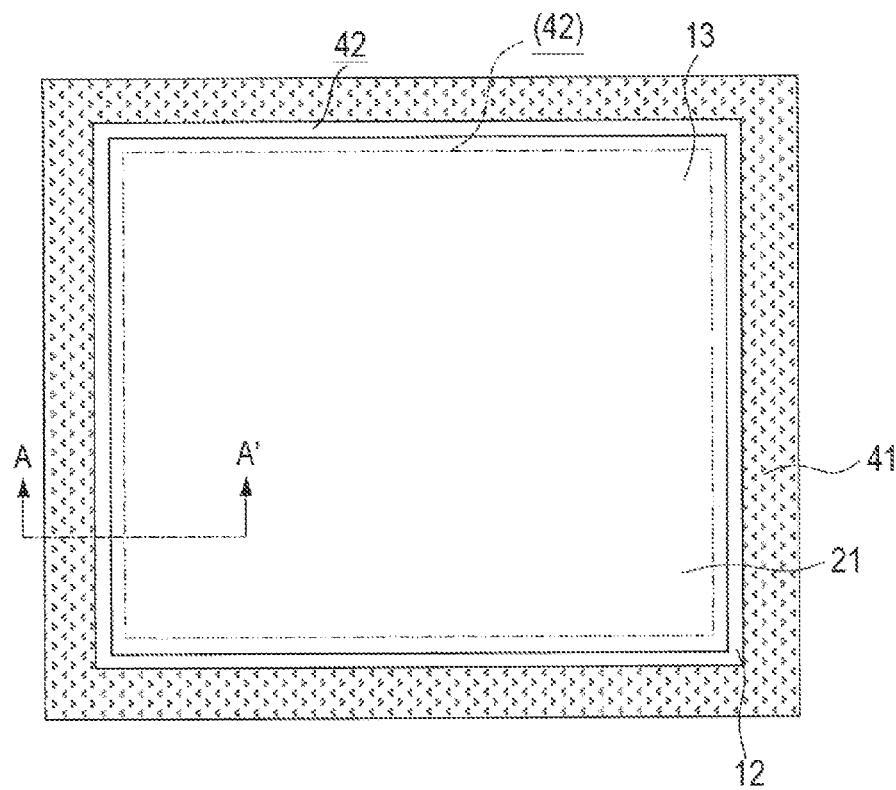
FIG. 6A is a planar layout diagram representing the first example of a manufacturing method.
Figure 6B:
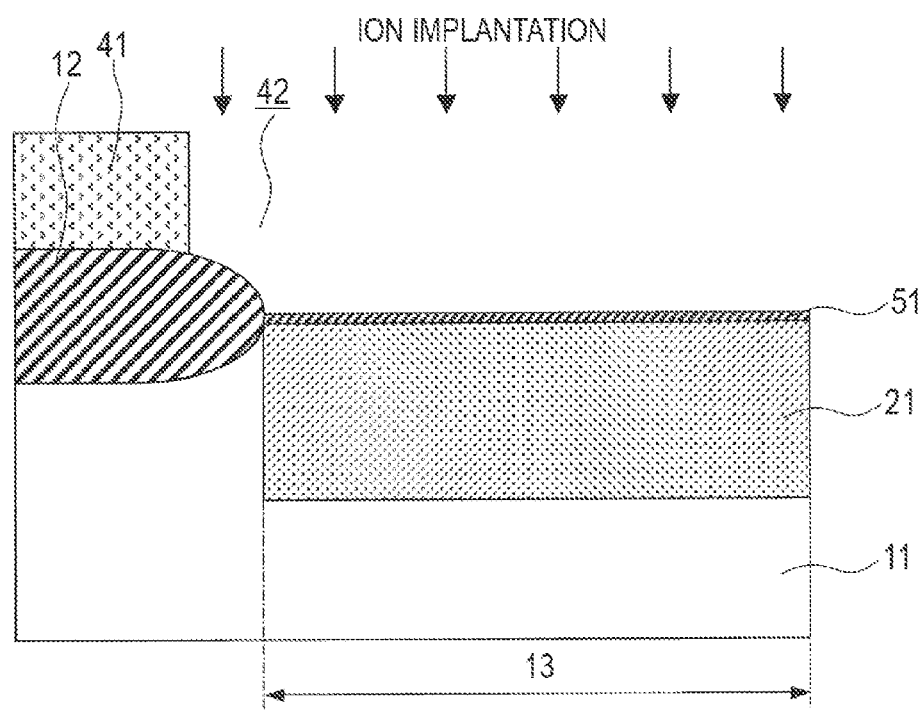
FIG. 6B is a cross sectional view representing a manufacturing step.

Then, as illustrated in FIGS. 6A and 6B, a pre-oxide film 51 is formed on a surface of the semiconductor substrate 11. The pre-oxide film 51 is formed by oxidizing the surface of the semiconductor substrate 11 using, for example, a thermal oxidation method.

Then, a resist film 41 is formed on the semiconductor substrate 11 using a resist coating technique, and the resist film 41 is patterned by using a lithography technique to form an opening portion 42 in a region where the first electrode is formed. In the example shown in the Figure, the first electrode 21 is formed throughout the active region 13; however, the opening portion 42 may be formed, for example, inside the active region 13, as indicated by long dashed double-short dashed lines in FIG. 6A.

Using an ion implantation method that uses the resist film 41 as an ion implantation mask, impurities are ion implanted in the active region 13 of the semiconductor substrate 11 to form the first electrode 21 formed of a diffusion layer. In the ion implantation, for example, n-type impurities such as phosphorus, arsenic, and antimony, or p-type impurities such as boron and indium are used, and the dose is set to, for example, $1 \times 10^{14}$ atoms/cm$^2$ or more. The implantation energy is appropriately selected depending on the impurities used for ion implantation.

Though not shown, low-concentration ion implantation is performed in a portion of the silicon substrate 11 underneath the edge of the element isolation region 12.

The resist film 41 is removed thereafter.

The state shown in the Figure is immediately before the removal of the resist film 41.

Figure 7A:
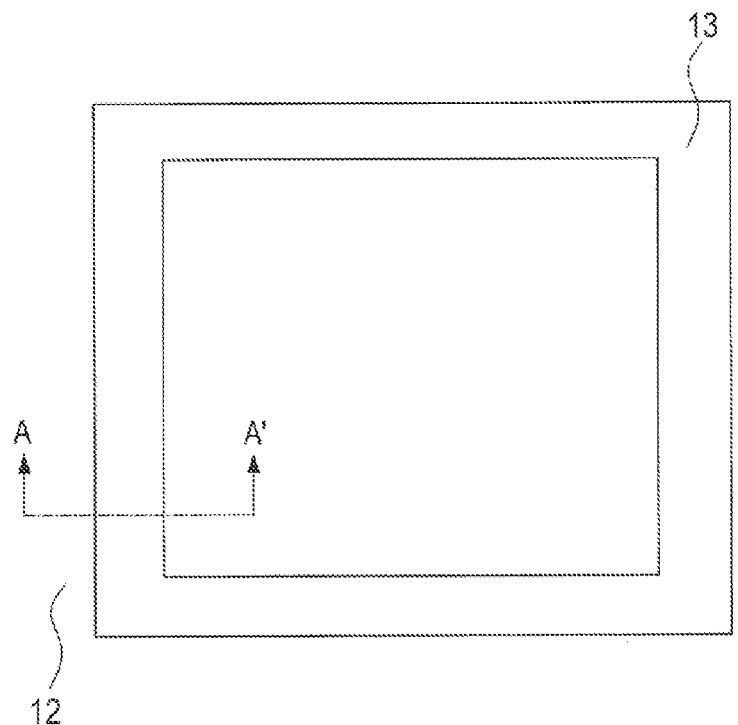
FIG. 7A is a planar layout diagram representing the first example of a manufacturing method.
Figure 7B:
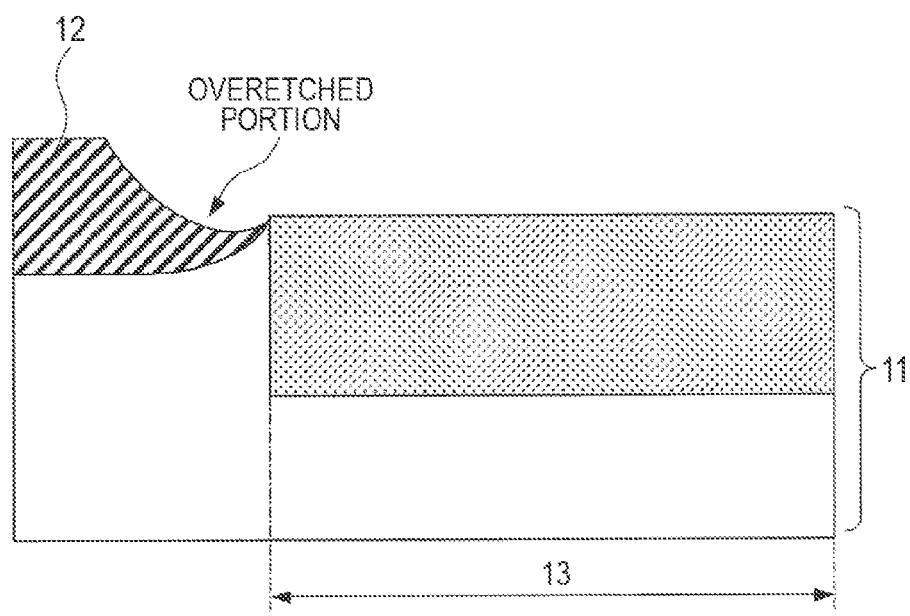
FIG. 7B is a cross sectional view representing a manufacturing step.

Then, as illustrated in FIGS. 7A and 7B, the pre-oxide film 51 (see FIGS. 6A, 6B and elsewhere) is removed to expose the surface of the semiconductor substrate 11 in the active region 13. The removal of the pre-oxide film 51 is performed by, for example, wet etching. For example, wet etching is performed using hydrofluoric acid-based chemicals. Here, etching also removes a portion of the element isolation region 12. Particularly, the portion of the element isolation region 12 uncovered by the resist film 41 (see FIGS. 6A, 6B and elsewhere) is damaged by the ion implantation and therefore overetched more than undamaged portions. The overetching of the silicon oxide film is particularly prominent in the bird's beak portion of the LOCOS structure.

Thereafter, the surface of the semiconductor substrate 11 is cleaned by SC washing (APM washing).

Figure 8A:
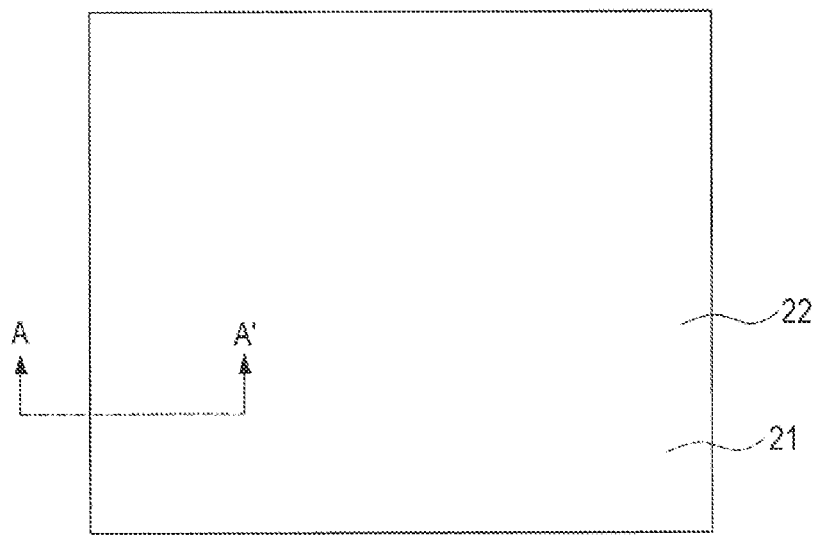
FIG. 8A is a planar layout diagram representing the first example of a manufacturing method.
Figure 8B:
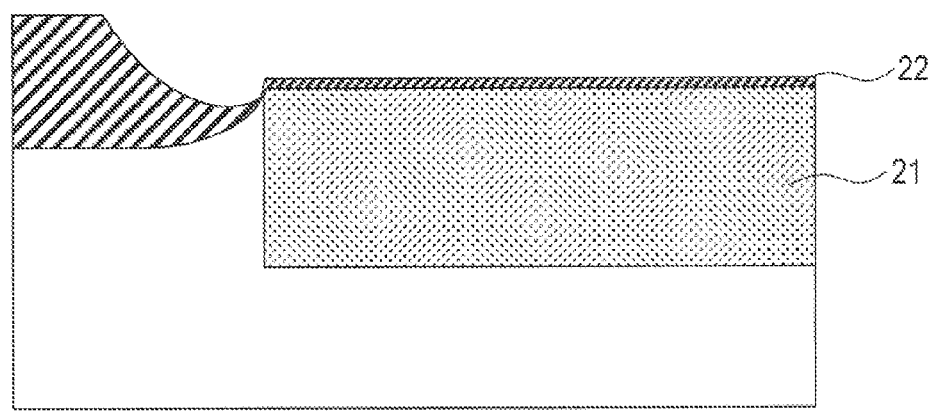
FIG. 8B is a cross sectional view representing a manufacturing step.

Then, as illustrated in FIGS. 8A and 8B, a capacitor insulating film 22 is formed on the first electrode 21 using, for example, thermal oxidation. Thus, the capacitor insulating film 22 is formed of a silicon oxide film. The thickness depends on the capacitance of the capacitive element, and is appropriately selected according to capacitance, for example, in a range of about 2 nm to about 50 nm.

Figure 9A:
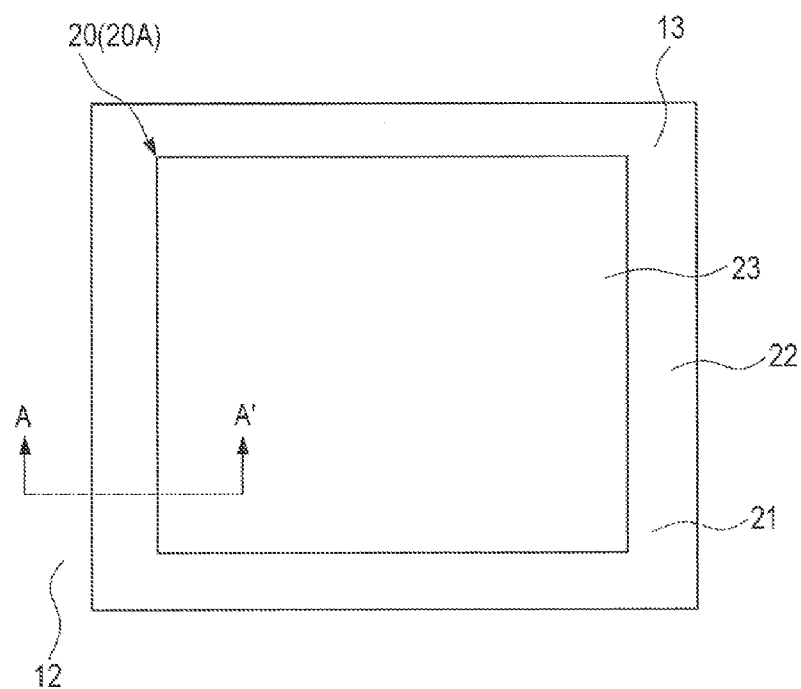
FIG. 9A is a planar layout diagram representing the first example of a manufacturing method.
Figure 9B:
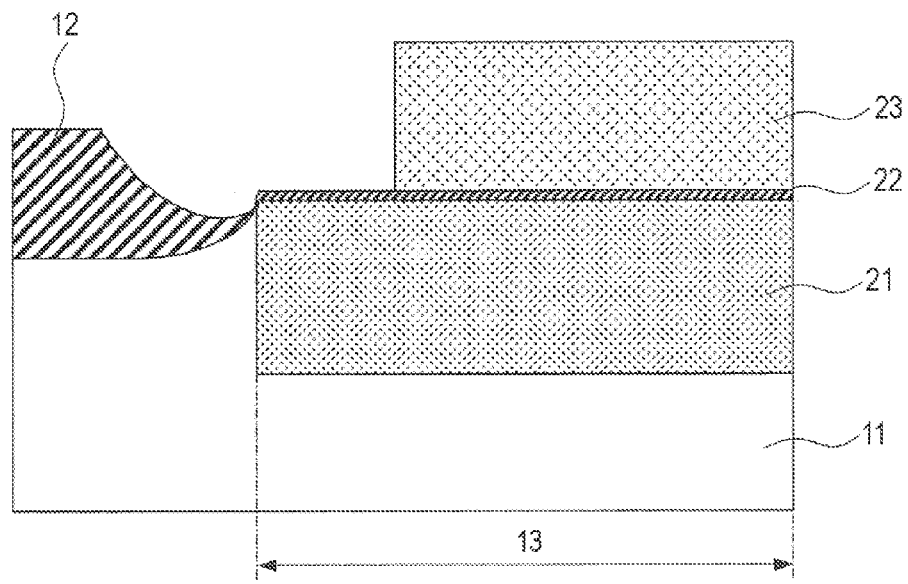
FIG. 9B is a cross sectional view representing a manufacturing step.

Then, as illustrated in FIGS. 9A and 9B, a second electrode 23 is formed on the planar surface of the first electrode 21 via the capacitor insulating film 22.

The second electrode 23 is formed within the active region 13 separated from the element isolation region 12 by a predetermined distance, and within the first electrode 21, in a planar layout.

For example, the second electrode 23 is formed by first forming an electrode-forming conductive film over the entire surface, and then patterning it using a common dry etching technique that uses a resist film as an etching mask (not shown). Electrode materials commonly used for semiconductor devices, for example, such as metal films and conductive polysilicon films can be used for the conductive film.

In this manner, the capacitive element 20 (20A) is formed that includes the first electrode 21, the capacitor insulating film 22, and the second electrode 23.

Thereafter, MIS transistors are formed on the semiconductor substrate 11, and an interlayer insulating film is formed, though not shown.

Figure 10:
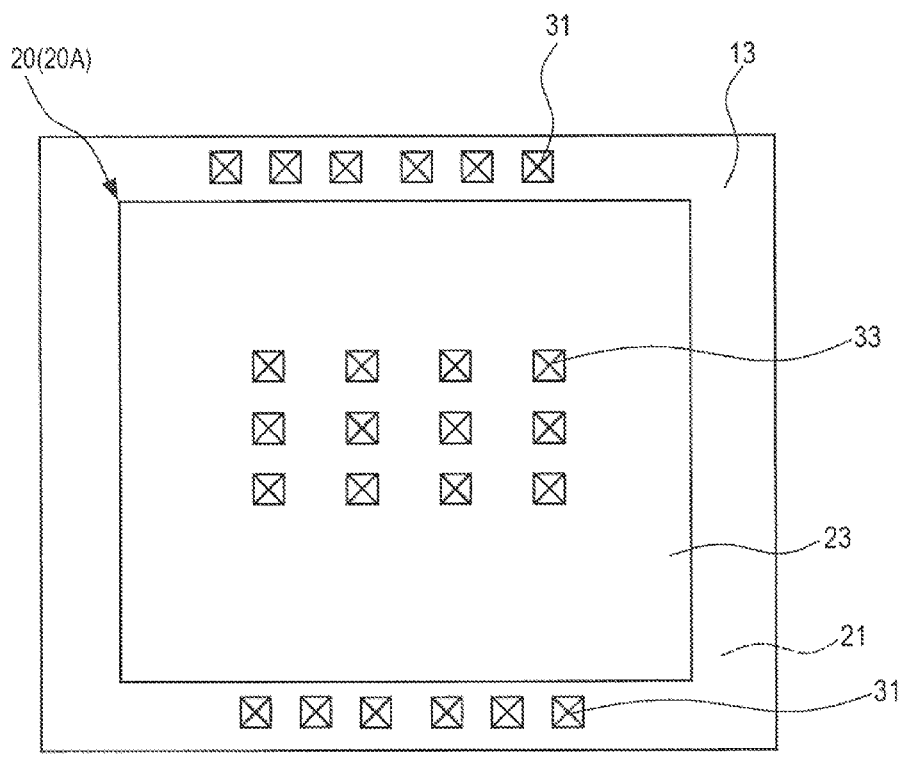
FIG. 10 is a planar layout diagram representing the first example of a manufacturing method.

Then, as illustrated in FIG. 10, contact portions 31 and contact portions 33 are formed through the interlayer insulating film (not shown) to provide interconnections to the first electrode 21 and the second electrode 23, respectively, of the capacitive element 20 (20A).

The contact portions 31 used to extract the first electrode 21 are formed, for example, on the first electrode 21 between the second electrode 23 and the element isolation region 12. As illustrated in the Figure, the contact portions 31 may be formed on the first electrode 21 along two sides of the second electrode 23, or along only one side of the second electrode 23. It is also possible to form the contact portions 31 on the first electrode 21 along three or four sides of the first electrode 21 or the second electrode 23.

Because the second electrode 23 are formed within the active region 13, the contact portions 33 used to extract the second electrode 23 are formed on the second electrodes 23 by being connected thereto. The state shown in the Figure includes a plurality of contact portions 33.

In the manufacturing method of the capacitive element 20A, the first electrode 21 is formed by, for example, ion implantation, after the element isolation region 12 is formed in the semiconductor substrate 11. Prior to the ion implantation, a pre-oxide film is formed on the surface of the semiconductor substrate 11. The pre-oxide film is removed after the ion implantation. Here, the peripheral portion of the element isolation region 12 is removed at the same time, and the surface of the semiconductor substrate 11 is exposed. Thus, the thickness of the capacitor insulating film 22 is uniform on the planar surface in the active region 13, whereas the portion formed on the exposed surface of the semiconductor substrate 11 after the removal of the element isolation region 12 is thin.

The second electrode 23 is formed on the planar surface of the first electrode 21, and accordingly the portion of the capacitor insulating film 22 underlying the second electrode 23 is also formed on the planar surface of the first electrode 21. That is, the capacitor insulating film 22 between the first electrode 21 and the second electrode 23 is formed on the planar surface of the first electrode 21, and thus has a uniform thickness.

Because the capacitive element 20A formed of the first electrode 21, the capacitor insulating film 22, and the second electrode 23 includes the capacitor insulating film 22 of a uniform thickness, there will be no parasitic capacitance, and the overall voltage following characteristics of the capacitive element 20A become desirable. Further, because the capacitor insulating film 22 does not have a thin portion, the voltage resistance does not deteriorate in any part of the film, and the voltage resistance of the capacitive element 20A is improved.

In other words, the overall voltage following characteristics of the capacitive element 20A become desirable, and the voltage resistance of the capacitive element can be improved for improved reliability.

[Second Example of a Manufacturing Method of a Capacitive Element]

The following describes a second example of a capacitive element manufacturing method according to the Second Embodiment of the present invention with reference to the planar layout diagrams and the cross sectional views of manufacturing steps illustrated in FIG. 11 to FIG. 16. The manufacturing method is an exemplary manufacturing method of the capacitive element 20B. The cross sectional views of FIG. 11 to FIG. 16 show cross sections taken along the line B-B' of the corresponding planar layout diagrams.

Figure 11A:
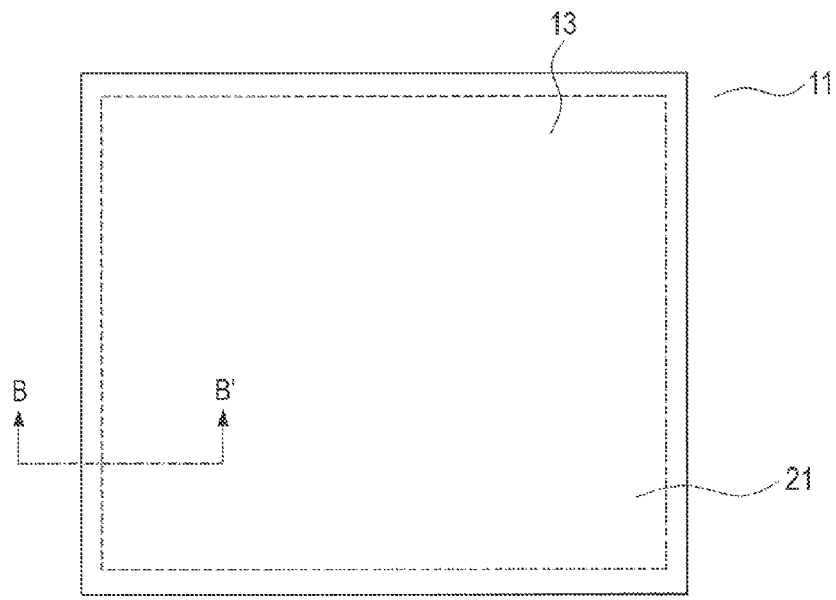
FIG. 11A is a planar layout diagram representing a second example of a manufacturing method of a capacitive element according to an embodiment of the present invention.
Figure 11B:
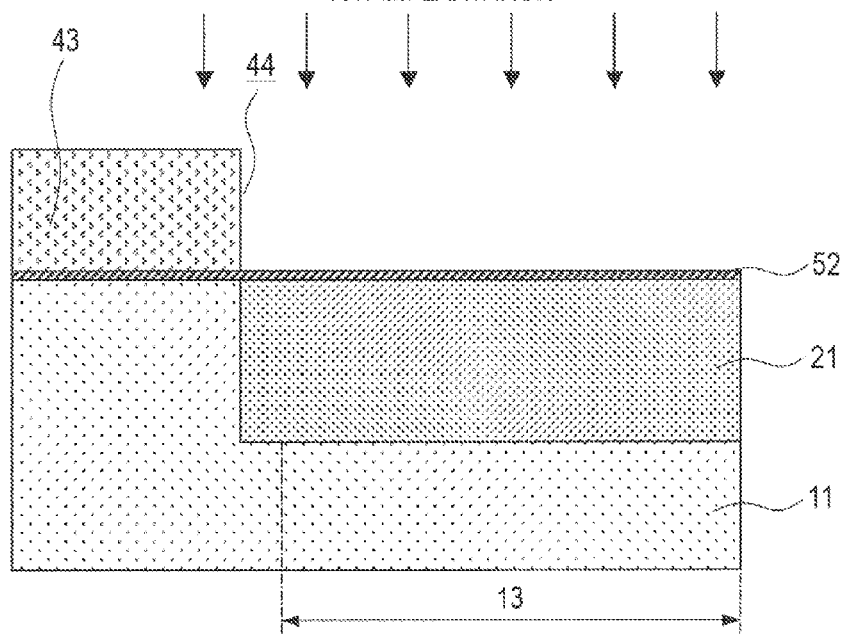
FIG. 11B is a cross sectional view of a manufacturing step.

As illustrated in FIGS. 11A and 11B, a pad oxide film 52 is formed on a surface of the semiconductor substrate 11, and impurities are ion implanted in the region of the semiconductor substrate 11 to be the active region so as to form the first electrode 21 formed of a diffusion layer.

The first electrode 21 is formed as follows. For example, a resist film 43 is formed on the pad oxide film 52 by using a resist coating technique, and the resist film 43 is patterned using a lithography technique to form an opening portion 44 in the region where the first electrode is to be formed. In a planar view, the opening portion 44 is larger than the first electrode 21 actually formed.

Then, by an ion implantation method using the resist film 43 as an ion implantation mask, impurities are ion implanted in the semiconductor substrate 11 through the pad oxide film 52 to form the first electrode 21 formed of a diffusion layer. The region where the first electrode 21 is formed essentially becomes the active region 13.

In the ion implantation, for example, n-type impurities such as phosphorus, arsenic, and antimony, or p-type impurities such as boron and indium are used, and the dose is set to, for example, $1\times10^{14}$ atoms/cm$^2$ or more. The implantation energy is appropriately selected depending on the impurities used for ion implantation.

The resist film 43 is removed thereafter.

The state shown in the Figure is immediately before the removal of the resist film 43.

Figure 12A:
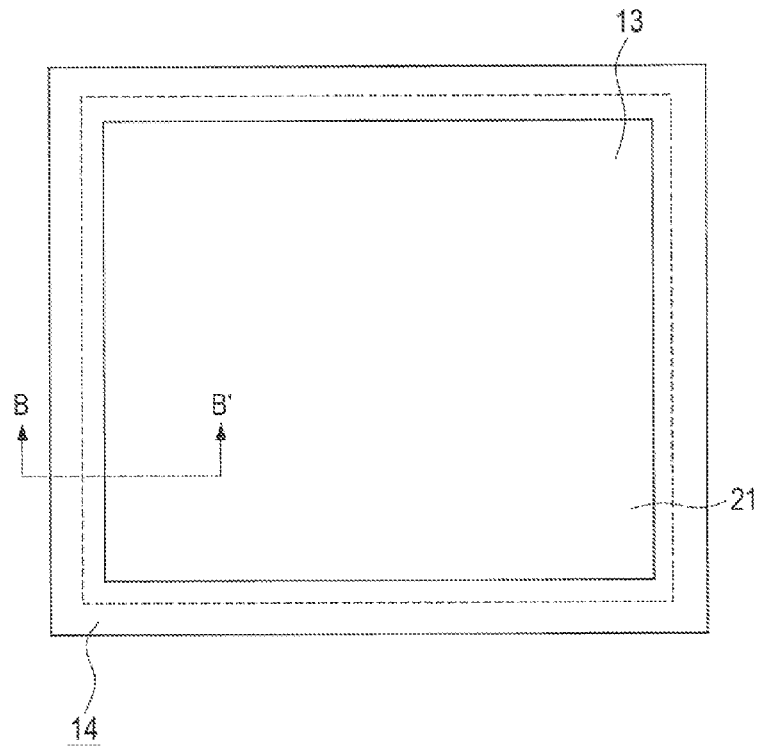
FIG. 12A is a planar layout diagram representing the second example of a manufacturing method.
Figure 12B:
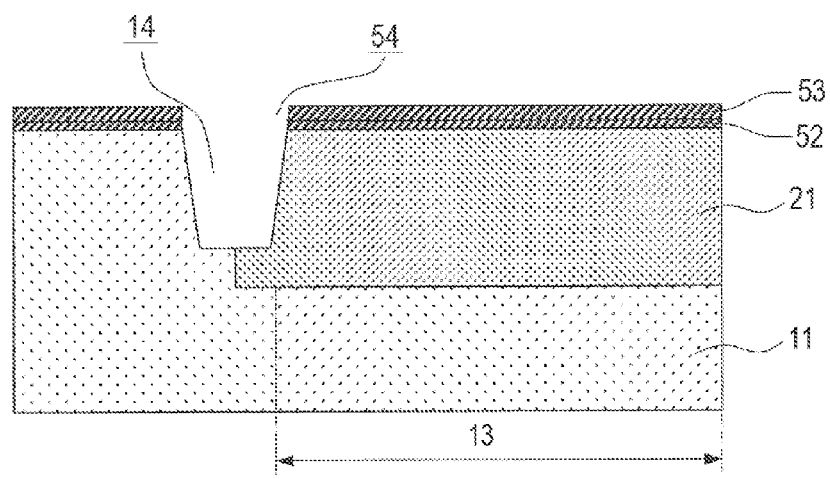
FIG. 12B is a cross sectional view representing a manufacturing step.

Then, as illustrated in FIGS. 12A and 12B, a silicon nitride film 53 is formed on the pad oxide film 52.

Thereafter, a resist film (not shown) is formed on the silicon nitride film 53 by using, for example, a resist coating technique, and the resist film (not shown) is patterned using a lithography technique to form an opening portion (not shown) on the region where the element isolation trench is to be formed.

Then, by dry etching using the resist film as an etching mask, an opening portion 54 for forming the element isolation trench is formed through the silicon nitride film 53 and the pad oxide film 52. The resist film used as an etching mask is removed thereafter.

Then, by dry etching using the silicon nitride film as an etching mask, an element isolation trench 14 for parting the active region 13 is formed in the semiconductor substrate 11. Here, the element isolation trench 14 is formed in part by removing the peripheral portion of the first electrode 21, and portions of the semiconductor substrate 11 surrounding it.

Figure 13A:
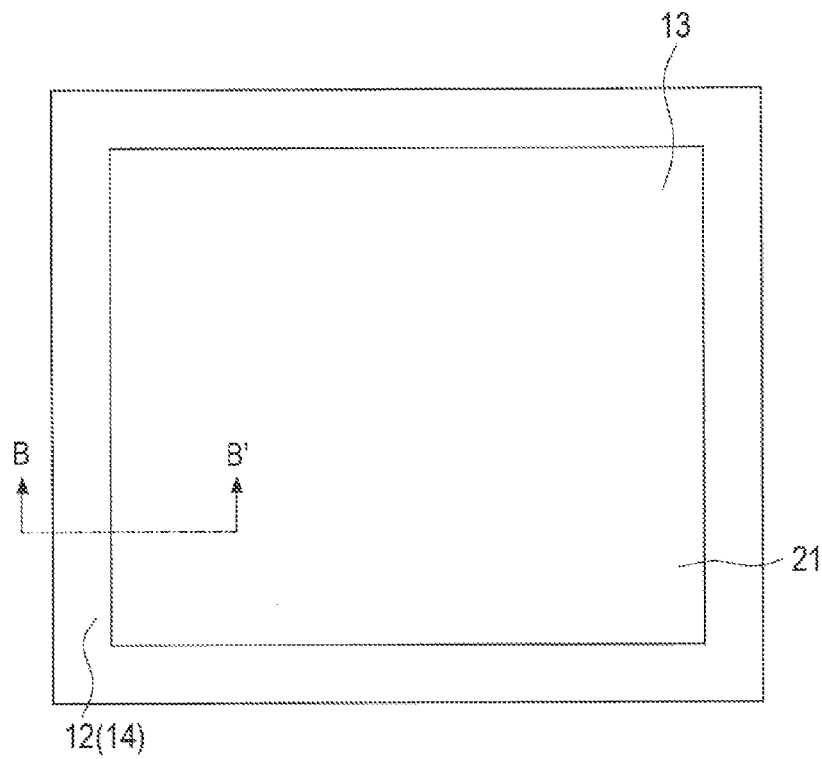
FIG. 13A is a planar layout diagram representing the second example of a manufacturing method.
Figure 13B:
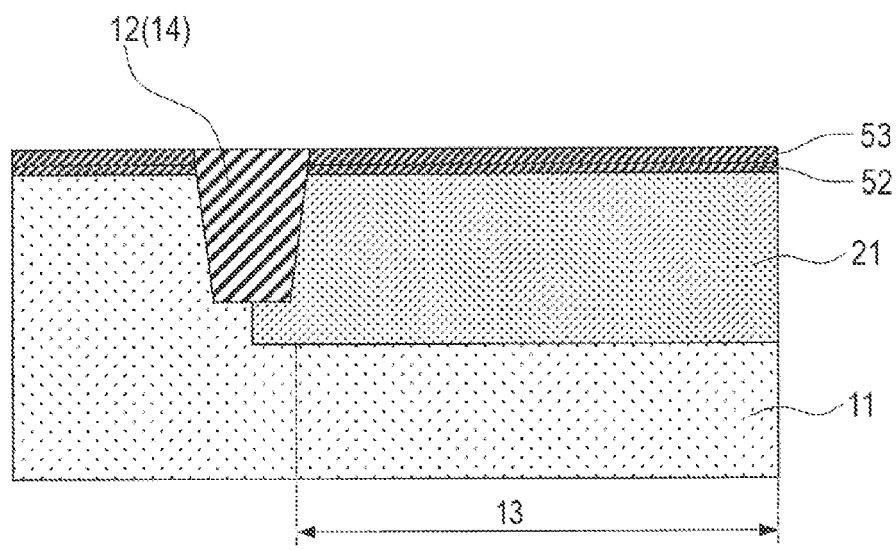
FIG. 13B is a cross sectional view representing a manufacturing step.

Then, as illustrated in FIGS. 13A and 13B, a thermally-oxidized film (not shown) is formed on the side walls and the bottom of the element isolation trench 14 using, for example, a thermal oxidation method, and an insulating film is embedded in the element isolation trench 14. The insulating film uses a silicon oxide film. For example, a high-density plasma (HDP) CVD method is used to form the silicon oxide film.

Thereafter, the excess insulating film on the silicon nitride film 53 is removed by a chemical mechanical polishing (CMP) method, and the insulating film embedded in the element isolation trench 14 forms the element isolation region 12 of an STI structure.

Then, the silicon nitride film 53 and the pad oxide film 52 are removed by, for example, wet etching. The wet etching of the silicon nitride film 53 uses, for example, hot phosphoric acid, and the wet etching of the pad oxide film 52 uses, for example, hydrofluoric acid-based chemicals.

The state shown in the Figure is before the removal of the silicon nitride film 53 and the pad oxide film 52.

Next, though not illustrated, a pre-oxide film is formed on the surface of the semiconductor substrate 11, and ion implantation is performed that adjusts the threshold voltage Vth of a transistor portion formed in other regions. The pre-oxide film is then removed by, for example, wet etching. Then, the surface of the semiconductor substrate 11 is cleaned by SC washing (APM washing). Note that because the pre-oxide film is formed by oxidizing the surface of the semiconductor substrate 11 using, for example, a thermal oxidation method, the pre-oxide film can be removed by using, for example, hydrofluoric acid-based chemicals.

Figure 14A:
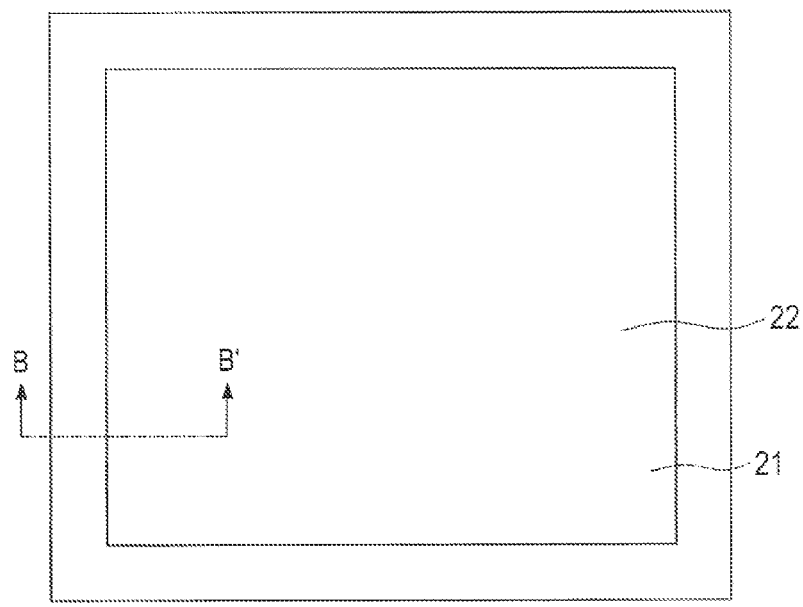
FIG. 14A is a planar layout diagram representing the second example of a manufacturing method.
Figure 14B:
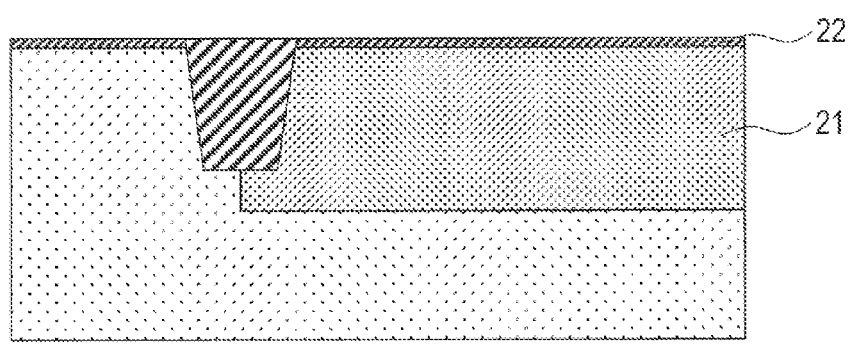
FIG. 14B is a cross sectional view representing a manufacturing step.

Then, as illustrated in FIGS. 14A and 14B, a capacitor insulating film 22 is formed on the first electrode 21 by, for example, thermal oxidation. Thus, the capacitor insulating film 22 is formed of a silicon oxide film. The thickness varies depending on the capacitance of the capacitive element, and is appropriately selected according to capacitance in a range of, for example, about 2 nm to about 50 nm.

Figure 15A:
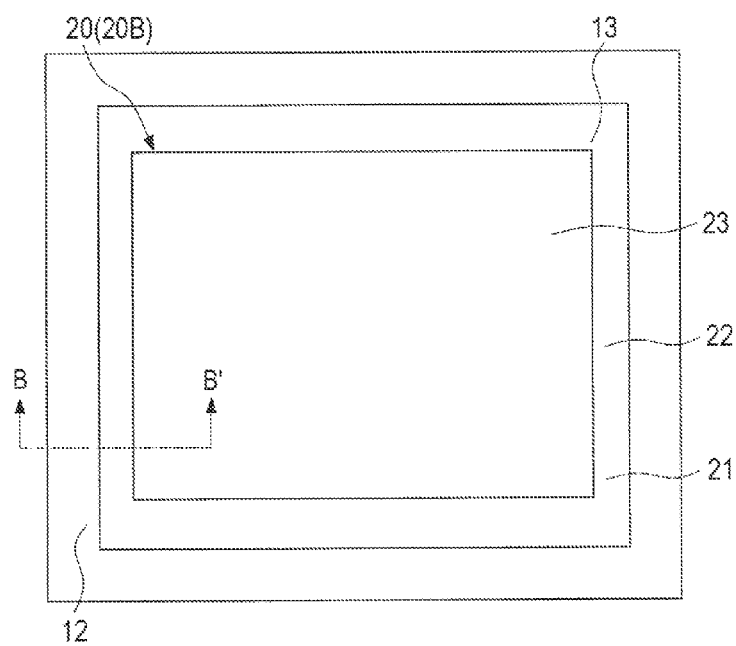
FIG. 15A is a planar layout diagram representing the second example of a manufacturing method.
Figure 15B:
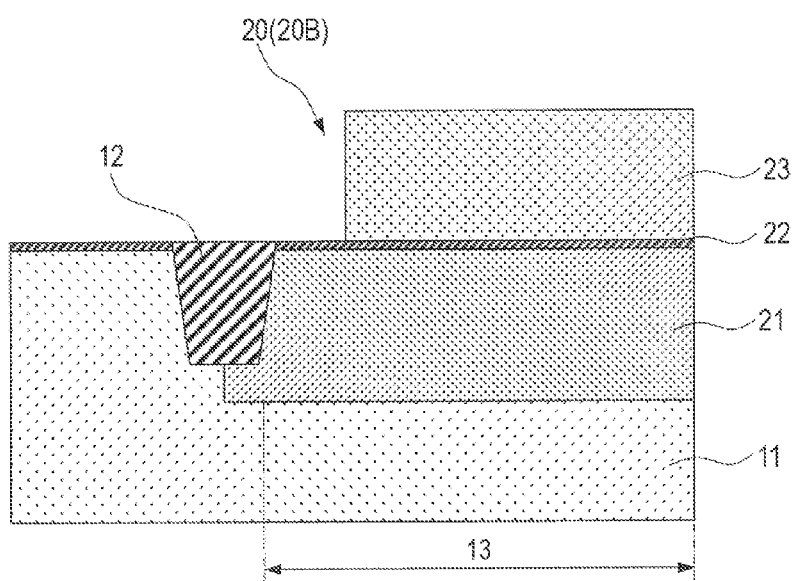
FIG. 15B is a cross sectional view representing a manufacturing step.

Then, as illustrated in FIGS. 15A and 15B, a second electrode 23 is formed on the planar surface of the first electrode 21 via the capacitor insulating film 22.

The second electrode 23 is formed within the active region 13 separated from the element isolation region 12 by a predetermined distance, and within the first electrode 21, in a planar layout.

For example, the second electrode 23 is formed by first forming an electrode-forming conductive film over the entire surface, and then patterning it using a common dry etching technique that uses the resist film as an etching mask (not shown). Electrode materials commonly used for semiconductor devices, for example, such as metal films and conductive polysilicon films can be used for the conductive film.

In a planar view, the second electrode 23 illustrated in the Figure is formed on the inner side of the first electrode 21; however, the second electrode 23 may be formed throughout the active region 13 where the first electrode 21 is formed, or may overlie on the element isolation region 12.

In this manner, the capacitive element 20 (20B) is formed that includes the first electrode 21, the capacitor insulating film 22, and the second electrode 23.

Thereafter, MIS transistors are formed on the semiconductor substrate 11, and an interlayer insulating film is formed, though not shown.

Figure 16:
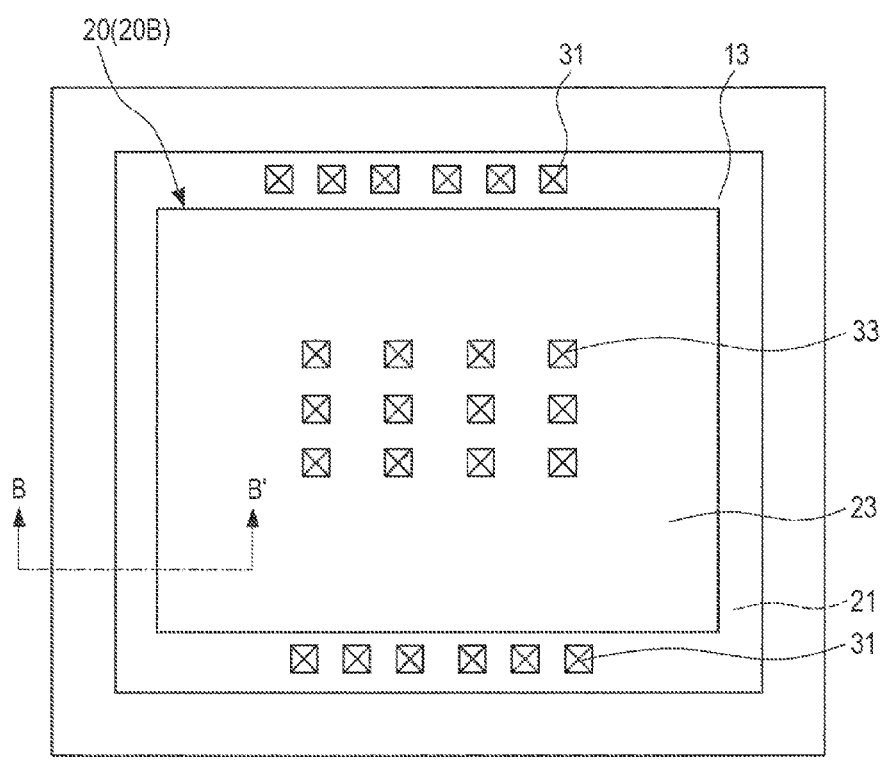
FIG. 16 a planar layout diagram representing the second example of a manufacturing method.

Then, as illustrated in FIG. 16, contact portions 31 and contact portions 33 are formed through the interlayer insulating film (not shown) to provide interconnections to the first electrode 21 and the second electrode 23, respectively, of the capacitive element 20 (20B).

The contact portions 31 used to extract the first electrode 21 are formed, for example, on the first electrode 21 between the second electrode 23 and the element isolation region 12. As illustrated in the Figure, the contact portions 31 may be formed on the first electrode 21 along two sides of the second electrode 23, or along only one side of the second electrode 23. It is also possible to form the contact portions 31 on the first electrode 21 along three or four sides of the first electrode 21 or the second electrode 23.

Because the second electrode 23 are formed within the active region 13, the contact portions 33 used to extract the second electrode 23 are formed on the second electrodes 23 by being connected thereto. The state shown in the Figure includes a plurality of contact portions 33.

In the manufacturing method of the capacitive element 20B, the first electrode 21 formed of a diffusion layer is formed by performing high-concentration ion implantation in the region of the semiconductor substrate 11 to be the active region 13, prior to forming the element isolation region 12 of an STI structure. Thereafter, the element isolation trench 14 that forms the element isolation region 12 is formed by removing the peripheral portion of the first electrode 21, and portions of the semiconductor substrate 11 surrounding it. Thus, the first electrode 21 as a high-concentration ion implantation region is formed throughout the active region 13, and the capacitor insulating film 22 formed on the first electrode 21 has a uniform thickness. Accordingly, the second electrode 23 is formed on the capacitor insulating film 22 of a uniform thickness.

Because the capacitor insulating film 22 has a uniform thickness, there will be no parasitic capacitance, and the overall voltage following characteristics of the capacitive element 20B become desirable. Further, because the capacitor insulating film 22 does not have a thin portion, the voltage resistance does not deteriorate in any part of the film, and the voltage resistance of the capacitive element 20B can be improved.

As a result, the reliability of the capacitive element 20B can be improved.

In forming the capacitive element 20C according to the second manufacturing method, the first electrode 21 is formed throughout the active region 13, and the capacitor insulating film 22 of a uniform thickness is formed on the active region 13 in a planar layout. In this way, the second electrode 23 can be formed also on the element isolation region 12, and an electrode pad portion continuous to the second electrode 23 can be formed on the element isolation region 12. When the first electrode 21 is formed on the inner side of the active region 13 instead of being formed throughout the active region 13, the first electrode 21 and the element isolation region 12 will be separated by a portion of the semiconductor substrate 11 where there is no impurity doping. When the capacitor insulating film 22 is formed in this state, the capacitor insulating film 22 will have different thicknesses on the first electrode 21 and the semiconductor substrate 11. Specifically, the capacitor insulating film 22 will be thick on the first electrode 21, and thin on the semiconductor substrate 11. In this case, the problems of conventional techniques remain unsolved. For this reason, the first electrode 21 is formed throughout the active region 13.

In the foregoing embodiments and variations, the silicon oxide film formed by oxidation is used for the capacitor insulating film 22; however, a silicon nitride film also may be used, for example. In this case, the silicon nitride film can be formed by nitriding the surface of the semiconductor substrate 11 (silicon substrate).

Further, a laminate film of a silicon oxide film and a silicon nitride film may be used for the capacitor insulating film 22. In this case, a laminate structure of silicon oxide film and silicon nitride film can be produced by first forming the silicon oxide film by oxidizing the surface of the semiconductor substrate 11 (silicon substrate), and then nitriding the surface of the silicon oxide film.

Further, a silicon oxynitride film may be used for the capacitor insulating film 22. In this case, the silicon oxynitride film can be formed by first forming the silicon oxide film by oxidizing the surface of the semiconductor substrate 11 (silicon substrate), and then nitriding the silicon oxide film.

<3. Third Embodiment>
[Solid-State Imaging Device Using a Capacitive Element]

An example of a solid-state imaging device using a capacitive element 20 according to an embodiment of the present invention is described below with reference to the block diagram of FIG. 17 and the circuit diagram of FIG. 18.

Figure 17:
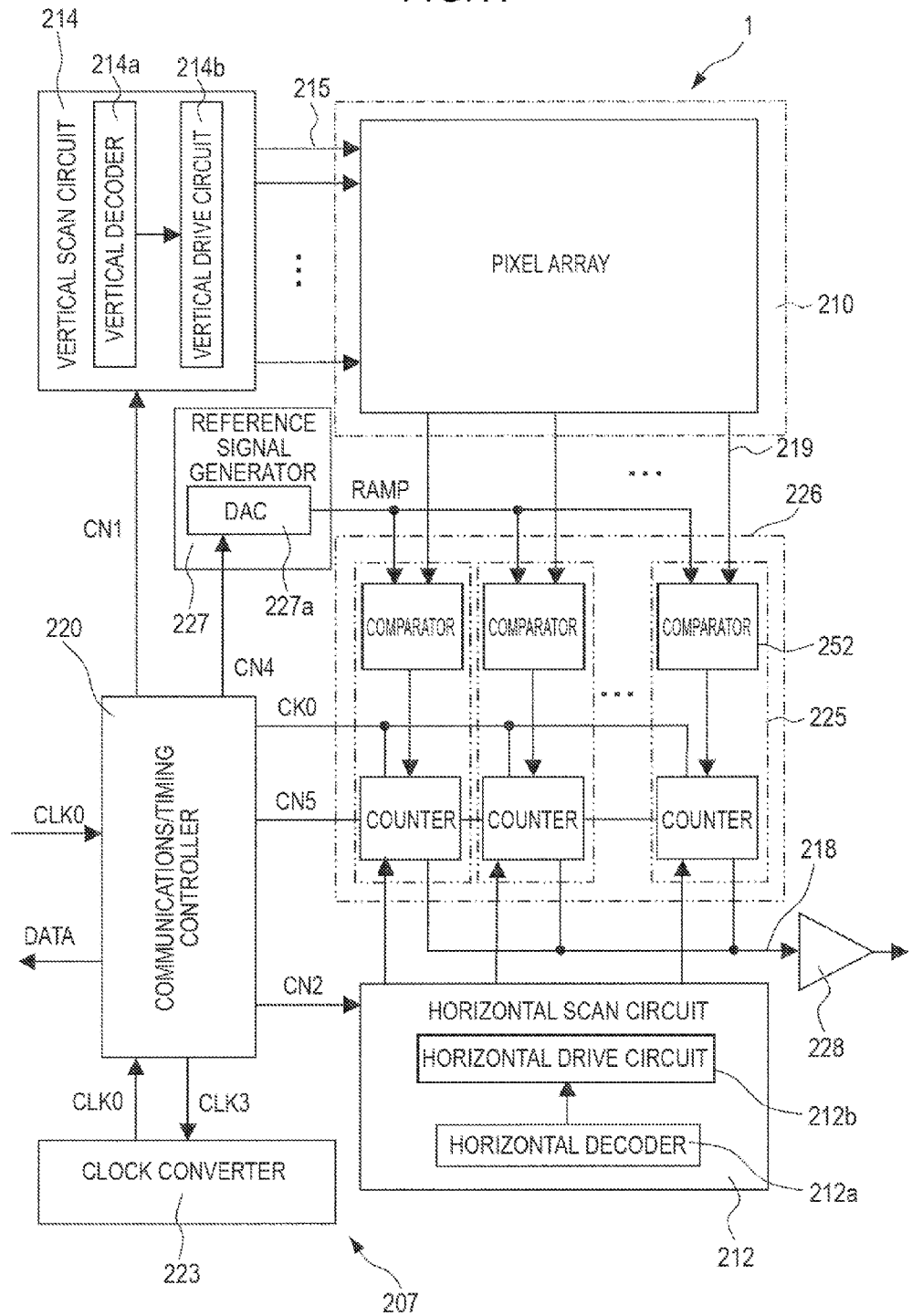
FIG. 17 is a block diagram representing an example of an application of a capacitive element.

As shown in FIG. 17, a solid-state imaging device 1 includes a pixel section 210 in which a plurality of unit pixels (not shown) is arrayed in a row and a column direction; a drive controller 207 provided outside of the pixel section 210; a column processor 226; a reference signal generator 227 that supplies reference voltage for AD conversion to the column processor 226; and an output section 228.

The drive controller 207 has the control circuit function of sequentially reading out signals of the pixel section 210. For example, the drive controller 207 includes a horizontal scan circuit 212 that controls a column address or a column scan, a vertical scan circuit 214 that controls a row address and a row scan, and a communications/timing controller 220 whose functions include the generation of an internal clock. The solid-state imaging device 1 further includes a clock converter 223 that generates pulses of a clock frequency faster than an input clock frequency.

The elements of the drive controller 207, as with the pixel section 210, are formed in semiconductor regions such as in monocrystalline silicon using the technique used in manufacture of semiconductor integrated circuits, and together constitute the solid-state imaging device.

The unit pixels include a photodiode as a light receiving element (photoelectric converter), and an intra-pixel amplifier (not shown) that includes a semiconductor element for amplification (for example, MOS transistor).

The intra-pixel amplifier has the structure of, for example, a floating diffusion amplifier. As an example, a four-transistor structure of transfer transistor, reset transistor, amplifying transistor, and select transistor can be used.

The transfer transistor reads out the signal charge generated in the photodiode.

The reset transistor, prior to the transfer of the signal charge from the photodiode to the floating diffusion section, resets the potential of the floating diffusion section to a reset voltage in response to a reset pulse fed to the gate electrode.

By the amplifying transistor, the potential of the floating diffusion section reset by the reset transistor is output as a reset level, and the potential of the floating diffusion section after the transfer of the signal charge by the transfer transistor is output as a signal level.

The select transistor brings the unit pixels in a select state, and causes the amplifying transistor to output signals.

The unit pixels are connected to the vertical scan circuit 214 via row control lines 215 for row selection, and connected, via vertical signal lines 219, to the column processor 226 that includes a column AD circuit 225 for each vertical column.

The horizontal scan circuit 212 and the vertical scan circuit 214 are structured to include a decoder, and adapted to start a shift operation (scan) in response to control signals CN1 and CN2 supplied from the communications/timing controller 220. Thus, the control signal CN1 includes various pulse signals (for example, such as reset pulse RST, transfer pulse TRF, and DRN control pulse DRN) for driving the unit pixels.

The communications/timing controller 220 receives master clock CLK0, a basic pulse corresponding to various drive pulses used to fetch to-be-processed analog pixel signals from the pixel section 210 to the column processor 226 side.

Further, the communications/timing controller 220 generates an internal clock based on the input master clock CLK0 and a high-speed clock generated in the clock converter 223.

The communications/timing controller 220 supplies clock and pulse signals of a predetermined timing necessary for the operation of each section. Further, in addition to receiving the master clock CLK0, the communications/timing controller 220 receives data DATA that instructs operation mode or the like, and outputs data containing the information of the solid-state imaging device 1.

Further, the communications/timing controller 220 supplies clock CLK1 having the same frequency as the input master clock CLK0, and low-speed clock CLK2 produced by dividing CLK1 in half, to each section, for example, such as the horizontal scan circuit 212, the vertical scan circuit 214, and the column processor 226 in the device.

The vertical scan circuit 214 selects rows of the pixel section 210, and supplies pulses necessary for these rows. For example, the vertical scan circuit 214 includes a vertical decoder 214a that specifies readout rows in the vertical direction, and a vertical drive circuit 214b provided for driving by supplying pulses to the row control lines 215 for the unit pixels of the readout addresses (row direction) specified by the vertical decoder 214a.

The horizontal scan circuit 212 functions to read out count values from the column processor 226. In synchronism with the low-speed clock CLK2, the horizontal scan circuit 212 sequentially selects the column AD circuit 225 of the column processor 226 under the control of the high-speed clock from the clock converter 223, and channels the signals to the horizontal signal lines 218. For example, the horizontal scan circuit 212 includes a horizontal decoder 212a that specifies readout rows in the horizontal direction, and a horizontal drive circuit 212b that channels the signals of the column processor 226 to the horizontal signal lines 218 according to the readout addresses specified by the horizontal decoder 212a. Note that the horizontal signal lines 218 are provided, for example, for the number of bits n handled by the column AD circuit 225 (where n is a positive integer). For example, when the number of bits n is 10 (n=10), ten horizontal signal lines 218 are provided corresponding to these bits.

The clock converter 223 generates pulses of a clock frequency faster than the input clock frequency. For example, the clock converter 223 receives the low-speed clock CLK2 from the communications/timing controller 220, and, based on the received clock, generates a clock of a frequency higher than CLK2 by at least two-fold. In the following, the frequency higher than CLK2 by at least two-fold is referred to as "high-speed clock CLK3." The low-speed clock CLK2 received from the communications/timing controller 220, and the high-speed clock CLK3 generated in the clock converter 223 are supplied to the communications/timing controller 220, and an output section 228 provided as an example of a data output section.

Based on the high-speed clock CLK3, the communications/timing controller 220 generates a reference signal (reference voltage) RAMP-generating reference clock (the same as CK0) for AD conversion, and a counter clock CK0 (of the same frequency as CLK3). Here, the high-speed clock CLK3 preferably has the frequency higher than the low-speed clock CLK2 by at least two-fold, preferably integer multiples.

In the solid-state imaging device 1, the output pixel signals of the unit pixels are supplied in units of vertical columns to the column AD circuits 225 of the column processor 226 via the vertical signal lines 219.

Each column AD circuit 225 of the column processor 226 sequentially receives the signals of the pixels in a single column, and processes these signals. For example, each column AD circuit 225 includes an ADC (Analog Digital Converter) circuit that converts analog signals into digital data of, for example, 10 bits, based on, for example, the high-speed clock CLK3.

The column AD circuit 225 starts counting with a clock signal upon receipt of a ramp-shaped reference signal RAMP at a comparator (voltage comparator) 252. For AD conversion, the input analog pixel signal via the vertical signal line 219 is compared with the reference signal RAMP, and counting is made until a pulse signal is obtained.

The digital pixel data converted in the column AD circuit 225 is sent to the horizontal signal line 218 via a horizontal select switch (not shown) driven by a horizontal select signal from the horizontal scan circuit 212, and input to the output section 228. Note that the number of bits is not limited to 10, and may be less than 10 (for example, 8 bits) or more than 10 (for example, 14 bits).

In this manner, the pixel section 210 sequentially outputs pixel signals of each vertical column in units of rows, and thus an entire collection of the pixel signals of the pixel section 210 represents a single image, or a frame image as it is called, corresponding to the pixel section 210 including an array of light receiving elements in a row and a column direction.

The reference signal generator 227 includes a DAC (DA converter; Digital Analog Converter) 227a. The reference signal generator 227 generates a stepped saw-tooth wave (ramp waveform) from the initial value represented by control data CN4 from the communications/timing controller 220, in synchronism with count clock CK0. The saw-tooth wave so generated is supplied as a reference voltage (ADC reference signal) for AD conversion to each column AD circuit 225 of the column processor 226.

The control data CN4 contains information used to provide the same rate of change for the digital data that varies as a function of time, so that the ramp voltage has the same slope (rate of change) for each comparison process. Specifically, it is preferable to vary the count value by 1 for each unit time specified by the count clock CK0.

The column AD circuit 225 includes the comparator 252 and a counter 254, and has an n-bit AD conversion function. The comparator 252 compares the reference signal RAMP generated in the DAC 227a, and the analog pixel signal obtained via the vertical signal line 219 from the unit pixels in units of the row control lines 215. The counter 254 counts the time for the comparator 252 to finish the comparison process, and holds the result.

From the communications/timing controller 220, the counter 254 receives a control signal CN5 that instructs a down-count operation mode or an up-count operation mode. Thus, the communications/timing controller 220 includes a control section (not shown) that switches the count process mode of the counter 254 depending on whether the comparator 252 is performing the comparison process with respect to the reset component $\Delta V$ or the signal component Vsig of the pixel signal.

The stepped reference signal RAMP generated in the reference signal generator 227 is commonly input to one of the input terminals RAMP of the comparators 252. The other input terminals are respectively connected to the vertical signal lines 219 of the corresponding vertical columns, and the pixel signal voltage from the pixel section 210 is individually input thereto. The output signal of the comparator 252 is supplied to the counter 254.

The count clock CK0 from the communications/timing controller 220 is commonly input to the clock terminals of the counters 254.

The counter 254 performs the count operation based on the count clock CK0, and the comparator output supplied from the comparator 252. The counter 254 is operable to perform the count process by switching between down-count operation and up-count operation (specifically, alternately) regardless of the count mode, using a common up/down counter (U/D CNT).

Further, the counter 254 receives a control pulse from the horizontal scan circuit 212 via a control line 212c. The counter 254 has the latch function of holding the count result, and holds the counter output value until instructed by a control pulse via the control line 212c.

The output of each column AD circuit 225 is connected to the horizontal signal line 218. The horizontal signal line 218 is provided in numbers corresponding to the width of n bits of the column AD circuit 225, and is connected to the output section 228 via a sense circuit (not shown) provided in the quantity n corresponding to the output lines (not shown).

In the solid-state imaging device 1 of the structure described above, the column AD circuit 225 performs the count operation in the pixel signal readout period, and outputs the count result at a predetermined timing. Specifically, the comparator 252 first compares the ramp waveform voltage from the reference signal generator 227 with the pixel signal voltage input via the vertical signal line 219. Upon matching of the voltages, the comparator output of the comparator 252 is inverted (the transition from H level to L level in this example).

At this time, the counter 254 has started the count operation either in the down-count mode or the up-count mode in synchronism with the ramp waveform voltage generated by the reference signal generator 227. When notified of the inverted information of the comparator output, the counter 254 stops the count operation, and latches (holds and stores) the current count value as pixel data to finish the AD conversion.

The counter 254 then sequentially outputs the stored and held pixel data to outside based on the shift operation by a horizontal select signal CH(i) input at a predetermined timing from the horizontal scan circuit 212 via the control line 212c.

Figure 18:
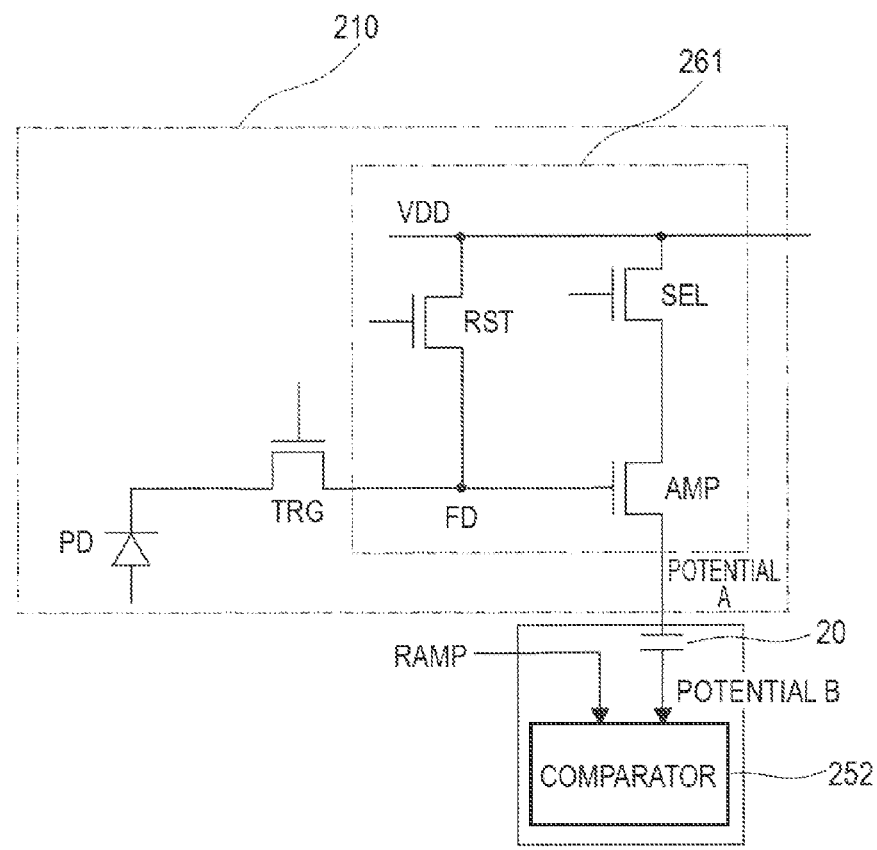
FIG. 18 is a circuit diagram representing an example of an application of a capacitive element.

As illustrated in FIG. 18, the capacitive element 20 of an embodiment of the present invention serves to cut the DC component, and is used between the intra-pixel amplifier 261 of the pixel section 210 and the comparator 252. Specifically, the capacitive element 20 is connected in series between the vertical signal line 219 and the comparator 252.

The comparator 252 compares the reference signal RAMP generated in the DAC 227a (see FIG. 17) with the analog pixel signal obtained via the vertical signal line 219 from the unit pixels in units of the row control lines 215 (see FIG. 17).

Here, the potential A of the vertical signal line 219 varies with changes in the potential of the photodiode PD of the pixel section 210. However, because the capacitive element 20 of an embodiment of the present invention with superior voltage following characteristics is connected to the vertical signal line 219, the change is offset by an amount of the capacitance of the capacitive element 20. The offset is voltage dependent. Because the comparator 252 compares the RAMP potential and the potential A, the voltage following characteristics are suppressed in the comparator 252.

Note that, in the pixel section 210, the signal charge obtained in the photodiode PD is read out by the transfer transistor TRG. Prior to the transfer of the signal charge from the photodiode PD to the floating diffusion section FD, the reset transistor RST resets the potential of the floating diffusion section FD to a reset voltage in response to a reset pulse fed to the gate electrode. By the amplifying transistor AMP, the potential of the floating diffusion section FD reset by the reset transistor RST is output as a reset level, and the potential of the floating diffusion section FD after the transfer of the signal charge by the transfer transistor TRG is output as a signal level. The select transistor SEL brings the unit pixels in a select state, and causes the amplifying transistor AMP to output signals.

<4. Fourth Embodiment>
[An Example of a Structure of an Imaging Apparatus]

An example of a structure of an imaging apparatus according to a Fourth Embodiment of the present invention is described below with reference to the block diagram of FIG. 19. The imaging apparatus uses a solid-state imaging device of an embodiment of the present invention.

Figure 19:
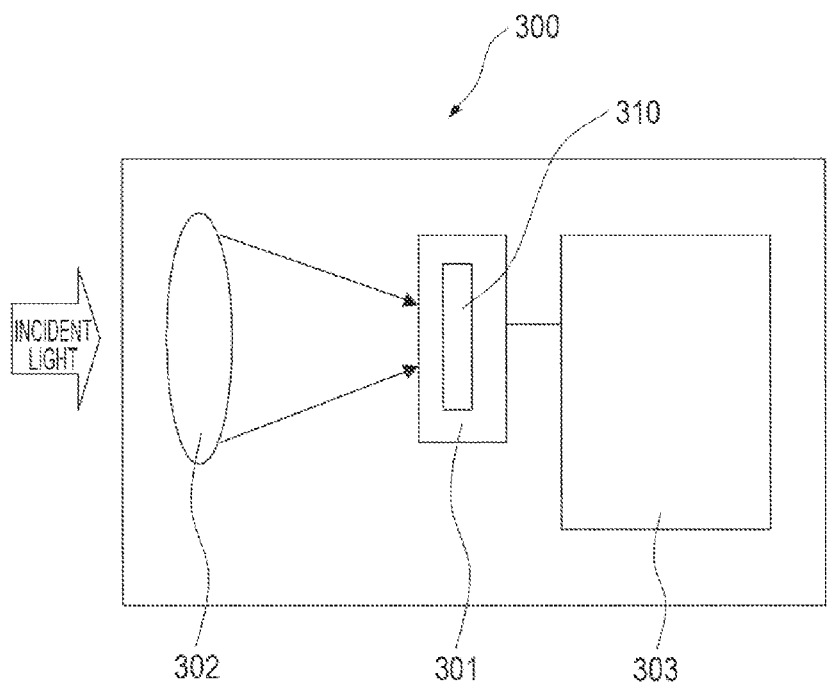
FIG. 19 is a block diagram representing an example of an imaging apparatus according to a Fourth Embodiment of the present invention.
Figure 20A:
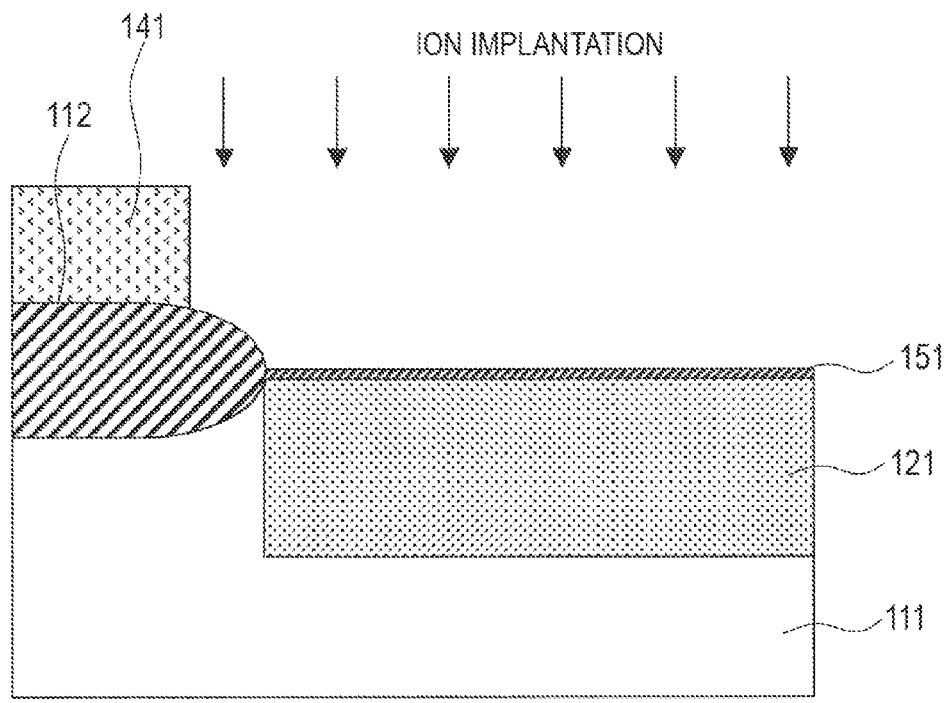
FIGS. 20A and 20B are cross sectional views representing manufacturing steps of a capacitive element of the related art.
Figure 20B:
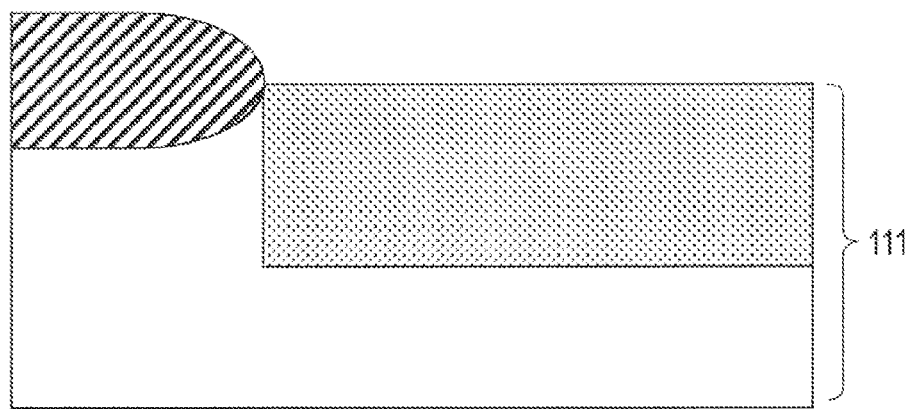
Figure 21A:
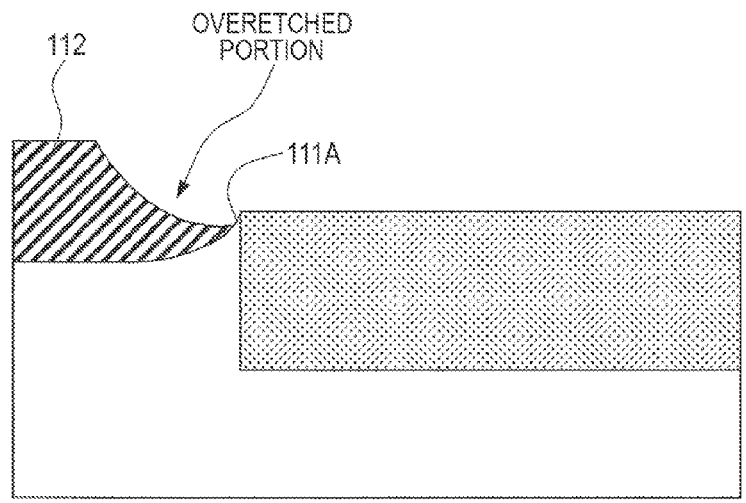
FIGS. 21A and 21B are cross sectional views representing manufacturing steps of a capacitive element of the related art.
Figure 21B:
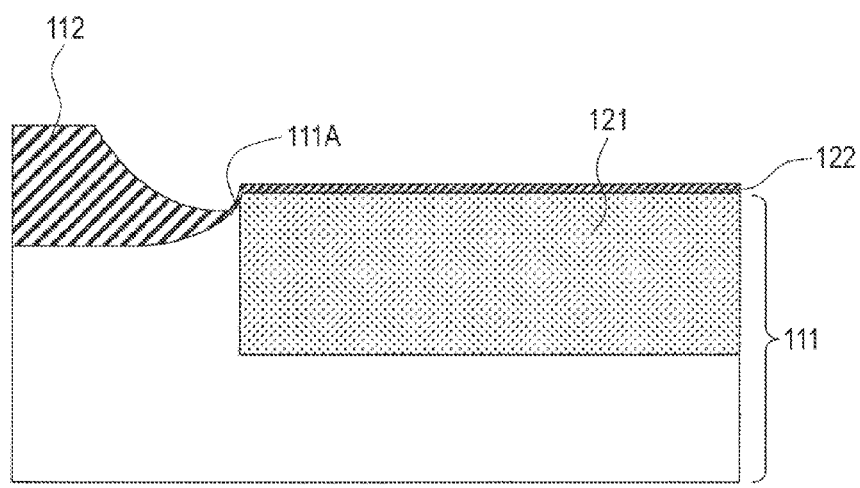
Figure 22:
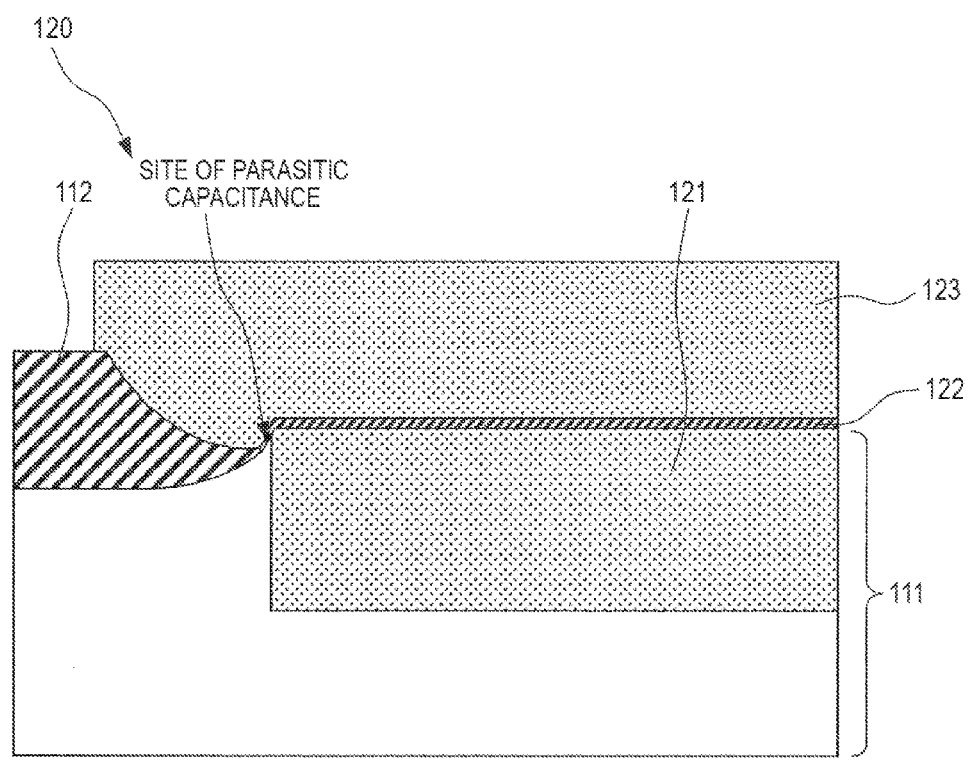
FIG. 22 is a cross sectional view representing a manufacturing step of a capacitive element of the related art.

As illustrated in FIG. 19, an imaging apparatus 300 includes a solid-state imaging device 310 in an sensing section 301. A light-condensing optical section 302 for focusing image is provided on the light condensing side of the sensing section 301. The sensing section 301 is connected to a drive circuit for driving the sensing section 301, and to a signal processor 303 that includes elements such as a signal processing circuit by which the signals subjected to photoelectric conversion in the solid-state imaging device 310 is processed into an image. The processed image signals in the signal processor 303 may be stored in an image storing section (not shown). In the imaging apparatus 300, the solid-state imaging device 1 described in the foregoing embodiments can be used for the solid-state imaging device 310.

The imaging apparatus 300 of an embodiment of the present invention uses the solid-state imaging device 1 of an embodiment of the present invention. Because the solid-state imaging device 1 is capable of stable signal processing, the imaging apparatus 300 can advantageously produce high-quality images.

The imaging apparatus 300 may be realized in one chip, or as an imaging module packaging the sensing section and the signal processor or the optical system. As the term is used herein, the imaging apparatus 300 means portable devices having, for example, camera or imaging functions. Further, the term "imaging" refers to not only the usual capturing of images with cameras but, in a broader sense, various image capturing processes including detection of fingerprints.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a capacitive element, the method comprising the steps of:
    ion implanting impurities in a region of a semiconductor substrate to be an active region so as to form a first electrode formed of a diffusion layer;
    forming in the semiconductor substrate an element isolation trench that parts the active region;
    embedding an insulating film in the element isolation trench to form an element isolation region;
    forming an insulating layer on the first electrode; and
    forming a second electrode on the insulating layer,
    the element isolation trench being formed in part by removing a peripheral portion of the first electrode, and portions of the semiconductor substrate surrounding the peripheral portion of the first electrode.

2. The method according to claim 1, wherein the second electrode is formed within the active region and within the first electrode in a planar layout.

* * * * *